US011016601B2

(12) United States Patent
Gray

(10) Patent No.: US 11,016,601 B2
(45) Date of Patent: May 25, 2021

(54) SENSOR SYSTEM WITH DRIVE-SENSE CIRCUIT

(71) Applicant: SIGMASENSE, LLC., Wilmington, DE (US)

(72) Inventor: Patrick Troy Gray, Cedar Park, TX (US)

(73) Assignee: SIGMASENSE, LLC., Wilmington, DE (US)

( * ) Notice: Subject to any disclaimer, the term of this patent is extended or adjusted under 35 U.S.C. 154(b) by 0 days.

(21) Appl. No.: 16/864,899

(22) Filed: May 1, 2020

(65) Prior Publication Data

US 2020/0257428 A1 Aug. 13, 2020

Related U.S. Application Data

(63) Continuation of application No. 16/109,600, filed on Aug. 22, 2018, now Pat. No. 10,678,372, which is a (Continued)

(51) Int. Cl.
*G06F 3/041* (2006.01)
*G06F 3/044* (2006.01)
(Continued)

(52) U.S. Cl.
CPC ...... *G06F 3/04166* (2019.05); *G06F 3/03545* (2013.01); *G06F 3/0446* (2019.05);
(Continued)

(58) Field of Classification Search
CPC .............................. G06F 3/041–047
See application file for complete search history.

(56) References Cited

U.S. PATENT DOCUMENTS 6,218,972 B1 4/2001 Groshong
6,665,013 B1 12/2003 Fossum et al.
(Continued)

FOREIGN PATENT DOCUMENTS

CN 102455838 A 5/2012
CN 103995626 A 8/2014
(Continued)

OTHER PUBLICATIONS

Baker; How delta-sigma ADCs work, Part 1; Analog Applications Journal; Oct. 1, 2011; 6 pgs.
(Continued)

*Primary Examiner* — Laurence J Lee
(74) *Attorney, Agent, or Firm* — Garlick & Markison; Timothy W. Markison; Shayne X. Short

(57) ABSTRACT

Circuitry, systems, and methods are provided that can acquire touch sensor data simultaneously for different modes of, for example, self, mutual, and pen, and with simultaneous sampling of the different channels. Drive/receive circuitry and methods of driving and receiving sensor electrode signals are provided that allow digital I/O pins to be used to interface with touch sensor electrodes using external passive filter components. Drive/receive circuitry is provided employing voltage following sigma-delta A/D coverts that are adapted to both drive and sense touch sensor signals on multiple frequencies simultaneously. This circuitry may be operated in modes to sense various combinations of mutual, self, and pen touch signals simultaneously. While capacitive multi-touch sensors are preferred, the circuits and methods herein are useful with many other types of touch sensors as well.

20 Claims, 24 Drawing Sheets

Related U.S. Application Data continuation of application No. 15/506,097, filed as application No. PCT/US2016/038497 on Jun. 21, 2016, now Pat. No. 10,120,498.

(60) Provisional application No. 62/183,062, filed on Jun. 22, 2015.

(51) Int. Cl.
    *G06F 3/0354*     (2013.01)
    *H03M 3/00*     (2006.01)

(52) U.S. Cl.
    CPC .... *G06F 3/04162* (2019.05); *G06F 3/041662* (2019.05); *H03M 3/458* (2013.01); *G06F 2203/04104* (2013.01)

(56) References Cited

U.S. PATENT DOCUMENTS

| | | | |
|---|---|---|---|
| 7,528,755 | B2 | 5/2009 | Hammerschmidt |
| 8,031,094 | B2 | 10/2011 | Hotelling |
| 8,089,289 | B1 | 1/2012 | Kremin et al. |
| 8,279,180 | B2 | 10/2012 | Hotelling et al. |
| 8,547,114 | B2 | 10/2013 | Kremin |
| 8,587,535 | B2 | 11/2013 | Oda et al. |
| 8,625,726 | B2 | 1/2014 | Kuan |
| 8,982,097 | B1 | 3/2015 | Kuzo et al. |
| 9,201,547 | B2 | 12/2015 | Elias |
| 2011/0063154 | A1 | 3/2011 | Hotelling et al. |
| 2011/0254795 | A1 | 10/2011 | Chen |
| 2011/0298745 | A1 | 12/2011 | Souchkov |
| 2012/0278031 | A1 | 11/2012 | Oda |
| 2013/0278447 | A1 | 10/2013 | Kremin |
| 2014/0327644 | A1 | 11/2014 | Mohindra |
| 2014/0347311 | A1 | 11/2014 | Joharapurkar |
| 2015/0091847 | A1 | 4/2015 | Chang |
| 2015/0346889 | A1 | 12/2015 | Chen |

FOREIGN PATENT DOCUMENTS

| | | |
|---|---|---|
| CN | 104182105 A | 12/2014 |
| JP | 2000165774 A | 6/2000 |
| KR | 20130050458 A | 5/2013 |
| KR | 1020150055019 | 5/2015 |
| WO | 2014046711 A1 | 3/2014 |

OTHER PUBLICATIONS

China National Intellectual Property Administration; Search Report; CN Application No. 201680002799.5; dated Aug. 5, 2019; 2 pgs.

European Patent Office; Extended European Search Report; EP Application No. 16815134.8; dated Aug. 7, 2018; 12 pgs.

International Search Authority; International Search Report and Written Opinion; PCT/US2016/038497; dated Oct. 18, 2016; 14 pgs.

Legend f1  Due to higher current flow caused by differential voltages and parasitic capacitance use a lower frequency f2  No mutual parasitic, lower current flow, longer sampling window. Use higher frequency and lower amplitude f3  Long sampling window Mutual (f1) 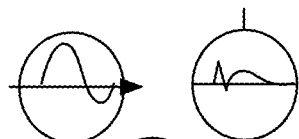 50-150Kz, as large Vpp as possible Self (f2)  100-200Khz, 500mVpp Receive 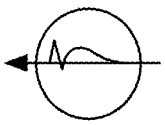 0-200Khz, combination of Dither And f2 to overcome Hysteresys Mutual (f1)
TX one line 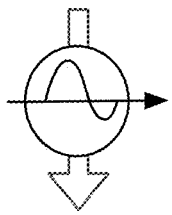

Clock Domains

| | |
|---|---|
| Σ Δ AtoD | 100-400Mhz |
| PWM | 10-40Mhz |
| DEMOD | 1-4Mhz |
| PROCESSOR | 40-100Mhz |

FIG. 2

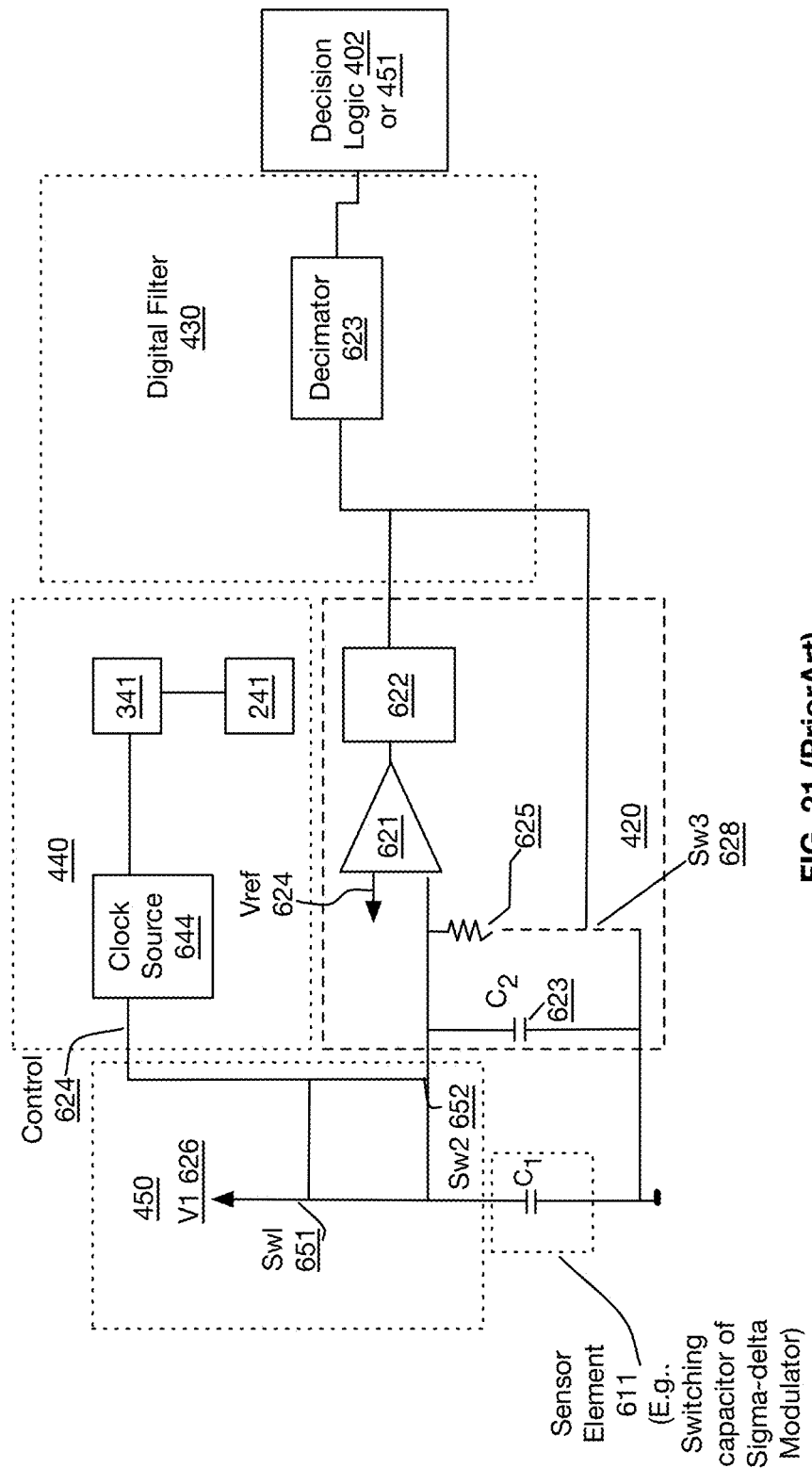
FIG. 21 (PriorArt)

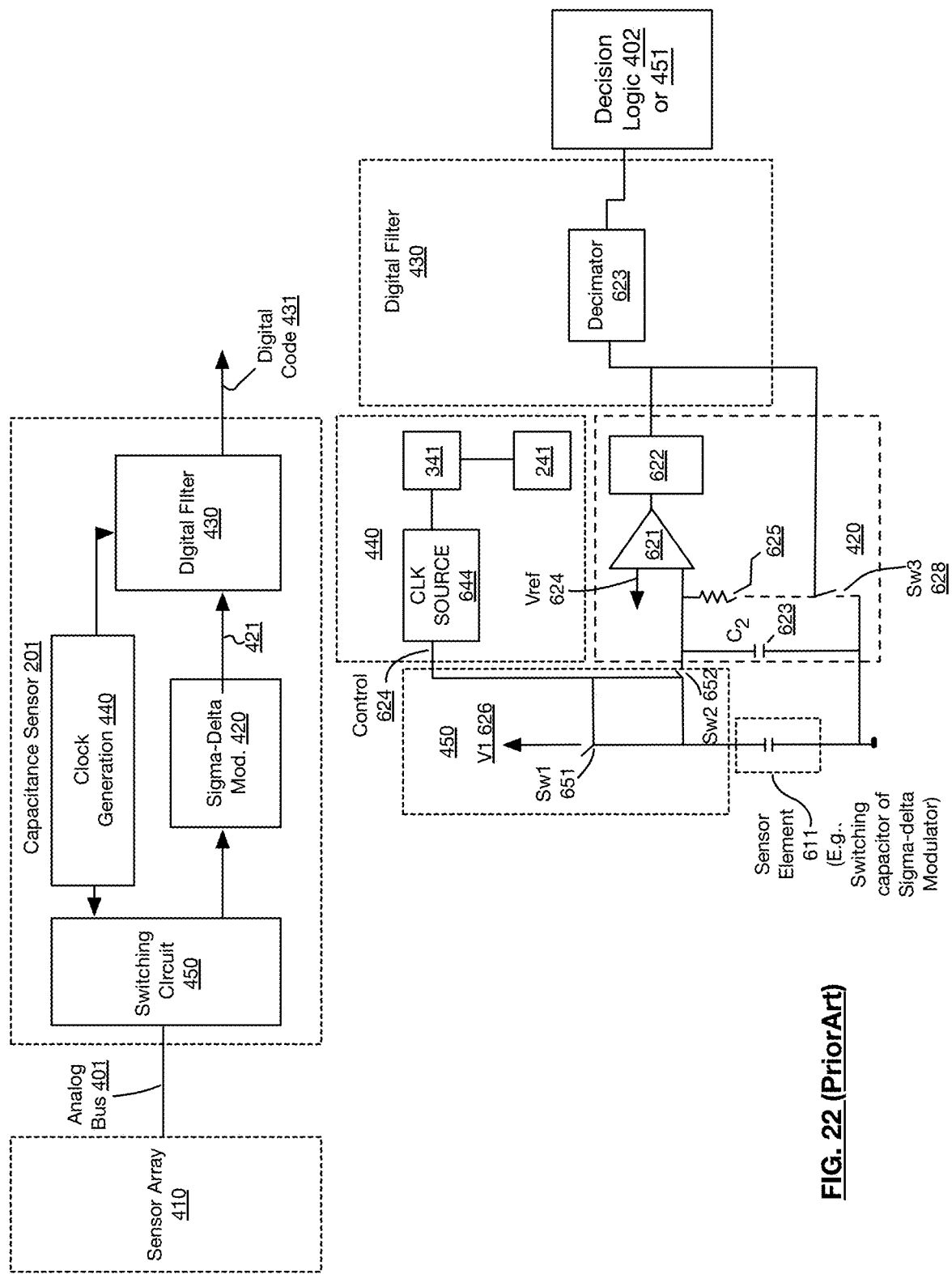
FIG. 22 (PriorArt)

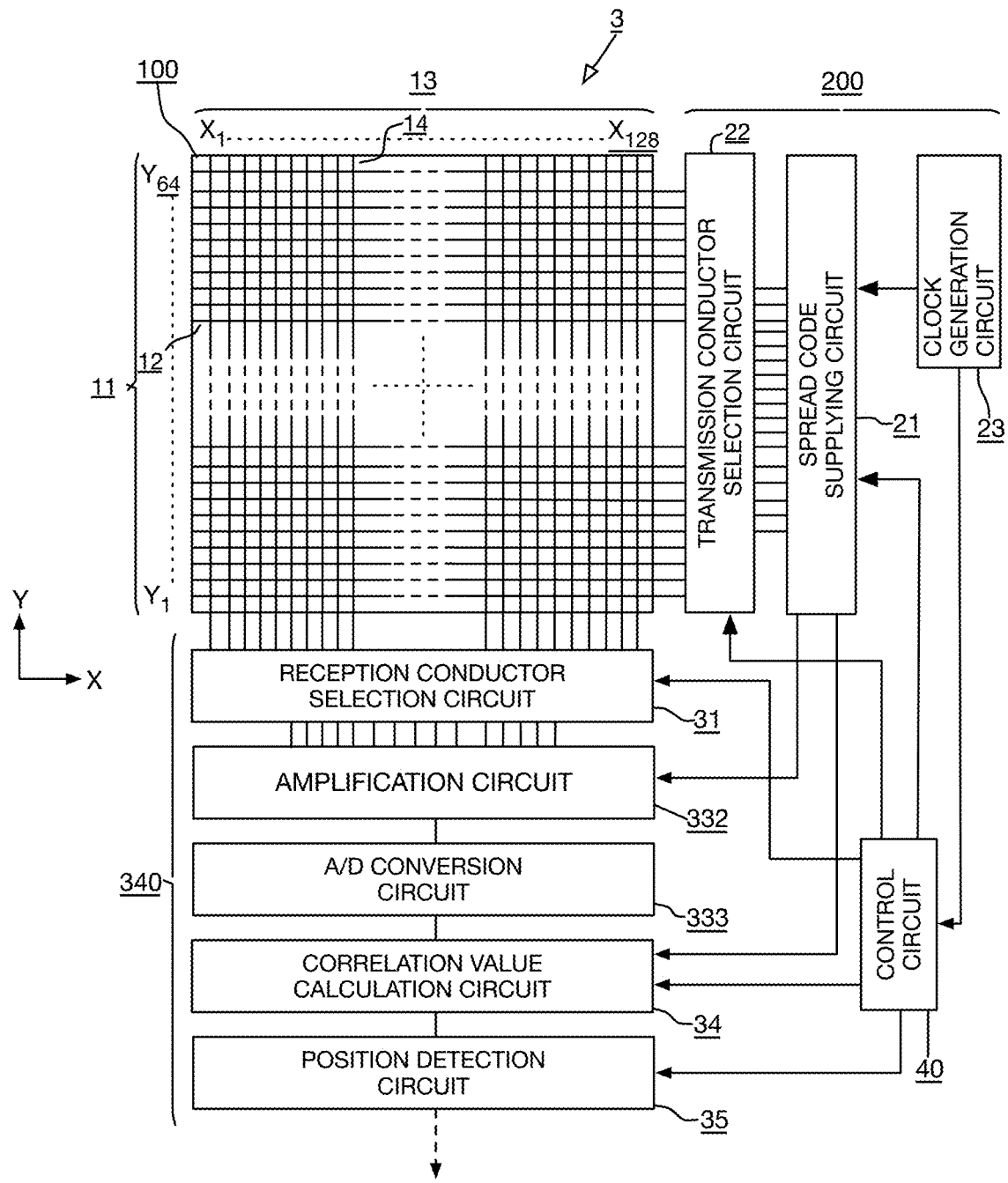
FIG. 23 (PriorArt)

SENSOR SYSTEM WITH DRIVE-SENSE CIRCUIT

CROSS REFERENCE TO RELATED APPLICATIONS

The present U.S. Utility patent application claims priority pursuant to 35 U.S.C. § 120/121 as a continuation of U.S. Utility application Ser. No. 16/109,600, entitled "TOUCH SENSOR SYSTEM INCLUDING CIRCUITS OPERATIVE TO PERFORM SIMULTANEOUS SIGNAL TRANSMISSION AND DETECTION OF SIGNAL CHANGE," filed Aug. 22, 2018, , which claims priority pursuant to 35 U.S.C. § 120 as a continuation of U.S. Utility application Ser. No. 15/506,097, entitled "MULTI-TOUCH SENSOR AND ELECTROSTATIC PEN DIGITIZING SYSTEM UTILIZING SIMULTANEOUS FUNCTIONS FOR IMPROVED PERFORMANCE," filed Feb. 23, 2017, now issued as U.S. Pat. No. 10,120,498 on Nov. 6, 2018, which is a U.S. National Stage Application submitted pursuant to 35 U.S.C. § 371 of Patent Cooperation Treaty Application No. PCT/US2016/038497, entitled "MULTI-TOUCH SENSOR AND ELECTROSTATIC PEN DIGITIZING SYSTEM UTILIZING SIMULTANEOUS FUNCTIONS FOR IMPROVED PERFORMANCE," filed Jun. 21, 2016, which claims priority pursuant to 35 U.S.C. § 119(e) to U.S. Provisional Application No. 62/183,062, entitled "MULTI-TOUCH SENSOR AND ELECTROSTATIC PEN DIGITIZING SYSTEM UTILIZING SIMULTANEOUS FUNCTIONS FOR IMPROVED PERFORMANCE," filed Jun. 22, 2015, all of which are hereby incorporated herein by reference in their entirety and made part of the present U.S. Utility patent application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

The invention relates in general to an improved multi-touch sensor and electrostatic pen digitizing systems, circuits, and methods.

Description of Related Art

Projected capacitive touch sensors typically include a substrate upon which electrodes for sensing a touch location are disposed. The substrate may be a durable glass having high optical transparency for viewing images displayed by an underlying display device that displays images such as graphical buttons and icons. When a user touches, for example with a finger or a stylus, on the outer surface of the substrate at a location corresponding to a desired selection displayed on the display device, the location is determined by sensing changes in capacitances to and between the electrodes.

In some projected capacitive touch sensors, the electrodes are arranged in rows of electrodes and columns of electrodes. The rows and columns are electrically isolated from one another via an insulating layer. A touch location is determined by driving electrodes of a first orientation (e.g., the column electrodes or drive electrodes) with a square wave signal (i.e., drive pulse). Sense circuitry coupled to the electrodes of the other orientation (e.g., the horizontal electrodes or sense electrodes) measures current flow between the electrodes due to mutual capacitive coupling that exists between the column electrodes and the row electrodes. The amount of current flow is directly proportional to the value of the mutual capacitance and therefore facilitates the determination of the mutual capacitance. The mutual capacitance between the intersection of a column electrode and a row electrode will change when a user touches the substrate in the vicinity of the intersection.

Typically, sense circuits for measuring the mutual capacitance operate by repetitively switching the sense electrodes to an input of an analog integrator circuit, which includes an amplifier with a feedback circuit that includes a capacitor that couples the amplifier output to the amplifier input. Such a circuit typically comprises a switch that couples the input of the integrator to the sense electrode just before each falling edge of the drive pulse that drives the drive electrodes and then uncouples just before each rising edge so as to integrate only signals of one polarity. The output of the integrator is then digitized and the digitized value is utilized to determine whether and where a touch has occurred.

However, the relative magnitudes of parasitic capacitances of the switch at the input of the integrator are large in comparison with the mutual capacitances between electrodes, which is typically measured in fractions of a picofarad. To overcome the effects caused by the parasitic capacitances, a number of integration cycles are performed before a touch location may accurately be determined. For example, the integrator may integrate the signal measured on the sense electrode over two hundred or more cycles, which could take 1 ms or more for a drive pulse with a frequency of 200 kHz. The length of time to make a determination increases with the number of electrodes that must be measured, which may affect user experience for relatively large displays that typically have a large number of electrodes to measure, relative to smaller pCap displays used in mobile devices.

A touch location can also be determined by driving electrodes of a first orientation only (e.g., the column electrodes) and sensing the current change only to the driven electrode. The sense circuitry measures current flow changes to the electrodes due to electrodes self-capacitive coupling that exists between the driven electrode and impedance paths to ground which can include paths from the electrode to other electrodes. The amount of current flow is directly proportional to the value of the impedance paths and therefore facilitates the determination of the self-capacitance. The self-capacitance will change when a user touches the substrate in the vicinity of the electrode altering the impedance paths to other electrodes but also adding new paths through the user to any ground potential.

In typical multi-touch systems the self-capacitive signal-to-noise ratio is much larger than the mutual capacitances due to the fact that that the self-capacitive signal contains the drive signal, the sensor parasitic capacitances, as well as the touch signal energy change whereas the mutual capacitance signal is much smaller as it only contains the cross parasitic capacitance and touch signal energy change. Also in typical systems the self-parasitic capacitances is large because the surrounding channels are effectively grounded as only one signal is driven at a time. Surrounding channels in this case are the channels adjacent and also crossing channels on a two axis system including the delivery traces to the touch area which are typically a very large portion of this parasitic capacitance. These parasitic capacitances interact with the pulse or square wave driving and sampling which contain high frequency harmonics. These harmonics contain a significant portion of the touch energy change which attenuates faster than the fundamental when passing down a RC impedance chain and back causing considerable signal and increasing signal loss as the touchscreen impedance rise.

In some previous capacitance touch sensor systems, the self-capacitance measurement has been used with guard electrodes where the adjacent electrodes are driven with the same signals so as to shield the electrode of interest from the current flow of the impedance paths of the target electrode and adjacent electrodes. The shielding also blocks current flow to further adjacent paths as the voltages of the adjacent shield electrodes supply almost all of the current and charging of these further capacitances and impedance paths. When correctly executed this self-capacitance measurement and shielding can be used to reduce the error signal due to contamination by a conductor such as salt water, which will tend to add to the users touch and will tend to bridge energy to surrounding impedance paths. This adjacent shield method does not block the alternate axis channels near and crossing the driven trace and so only shields about half the possible impedance paths. The ability to measure a touch in the presence of salt water contamination on the touch sensor is in some cases such as industrial, marine, or military applications, highly desired but does not work well on the current solutions available.

Typical touch control circuits have the ability to measure the different modes self or mutual capacitance or even to measure only the un-driven state of the electrodes as a method of receiving only external signals. But aside from driving a few shield electrodes or a drive/sense pair typically the modes of sampling can occur only one mode at a time. The length of time to make a determination for each mode increases with the number of electrodes that must be measured, which may affect user experience for relatively large displays that typically have a large number of electrodes to measure, relative to smaller pCap displays used in mobile devices.

Sigma-Delta Analog to Digital Converters (~ti.ADC) have been known for some time but have recently become very popular as programmable logic clock speeds have improved to the point where very good conversion function is possible. Many new ideas and work centered on improving these converters speed and functionality has been in an effort to allow this more digital conversion method to replace the more standard analog techniques. In the touch realm many improvement patents have been granted around incorporation of known capacitive sampling techniques and Delta Sigma conversion of analog to digital.

U.S. Pat. No. 8,089,289 has an example of prior art technology using a Delta Sigma Converter and showing mutual capacitive scheme using square wave drive and switched capacitor function with rectification in two embodiment drawings of the same function, as shown in FIG. 20.

U.S. Pat. No. 7,528,755 shows an example of prior art technology using a Delta Sigma Converter and showing scheme capable of signal drive or measure technique selectable via a mux as shown in FIG. 21.

U.S. Pat. No. 8,547,114 shows an example of prior art technology using a Delta Sigma Converter and switched capacitor techniques as shown in FIG. 22.

U.S. Pat. No. 8,587,535 shows an example of a prior art strategy, this state of the art mutual capacitance multi-touch system with simultaneous digital square wave patterned transmission and simultaneous receive with synchronous demodulation and pen capable, as shown in FIG. 23. This system does not allow multi-mode concurrent touchscreen sampling, does not have true simultaneous sampling due to each row using a different bit pattern which effectively scrambles the noise distribution on receipt, is not capable of self-capacitance measurements, and due to the use of square wave drive has a receive signal spectrum that contains the primary frequency as well as its harmonics which necessitate lower trace impedance to prevent attenuation of the higher harmonics across the panel.

The systems shown do not allow multi-mode concurrent touchscreen sampling, do not have true simultaneous sampling, use pulse or square wave sampling which does not allows for anti-alias filtering and have high frequency components necessitating lower touchscreen impedances, and all but the last uses mux arrays with high parasitic capacitances.

Therefore, a need exists for a much faster sampling method that can acquire data simultaneously for different modes of, for example, self, mutual, and pen, and with simultaneous sampling of the different channels.

Also, in some applications, to reduce the sample time via signal to noise ratio improvement where possible, continuous sampling schemes and advanced filter methods, modulation and demodulation schemes, and digital domain methods are needed. To keep the cost and power usage as low as possible the circuitry should be as much in the digital realm as possible.

Finally, many different touch sensors are now available that work through the measurement of changes to impedance, and providing a system that can handle multiple sensor types and configurations, including those currently known and those to be developed in the future, is also greatly desired.

SUMMARY

Circuitry, systems, and methods are provided that can acquire touch sensor data simultaneously for different modes of, for example, self, mutual, and pen, and with simultaneous sampling of the different channels. Drive/receive circuitry and methods of driving and receiving sensor electrode signals are provided that allow digital I/O pins to be used to interface with touch sensor electrodes using external passive filter components. Drive/receive circuitry is provided employing voltage following sigma-delta A/D coverts that are adapted to both drive and sense touch sensor signals on multiple frequencies simultaneously. This circuitry may be operated in modes to sense various combinations of mutual, self, and pen touch signals simultaneously. While capacitive multi-touch sensors are preferred, the circuits and methods herein are useful with many other types of touch sensors as well.

Some embodiments are capable of utilizing semiconductor programmable logic to simultaneously transmit and receive a plurality of frequencies simultaneously on a plurality of channels giving longer sample windows for pen and self-capacitance signals, simultaneous self-capacitance sampling which makes external noise common mode to all data readings, simultaneous sampling of mutual capacitance makes external noise common mode to all receive data, simultaneous sampling of mutual, self, pen with multiple pin solutions, low energy self-capacitance for finger/hand proximity, low energy receive capability for Pen proximity, standard radio frequency processing for signal isolation, and reduced dither logic, among other solutions to prevalent problems in the touchscreen realm.

Object of some embodiments of the present invention is to provide a system directed to a digital realm multi-touch and pen system capable of interfacing to multiple touchscreen types, customization and implementation in programmable logic hardware or fixed silicon, with improved sampling capabilities and noise rejection capabilities.

Further, the drive circuit and method in some embodiments implement a mixture of dither and self-capacitance carrier frequency to overcome the potentially large hysteresis of the digital input 1-bit Sigma Delta Analog to Digital Converter when implemented on a digital input.

Further, the operation in some embodiments of the self-capacitance mode with all channels simultaneously allows for almost ideal self-capacitive salt water rejection.

Further, the system in some embodiments can use advanced modulation and demodulation schemes to reduce noise at or near the frequencies used to drive the different modes of function.

Further, the system in some embodiments is capable of driving and sampling a plurality of sensors and sensor types.

Further, the system in some embodiments is capable of dual or more mutual capacitive axis scanning using separate frequencies.

Further, the system in some embodiments is capable using a digital input pin with settable transition reference or a differential analog type input pin with a comparator type circuitry.

Further, in some embodiments simultaneous sampling enables a method for identification and removal of noise using linear or non-linear filtering not possible with existing technology.

In view of the foregoing, some embodiments of the present invention provide a multi-touch system capable of greatly enhanced performance in speed of function, resolution, sensitivity, immunity, and capability to handle multiple types of input sensor configurations and input device types.

These together with other objects and advantages which will become subsequently apparent reside in the details of construction and operation as more fully hereinafter described and claimed, reference being had to the accompanying drawings forming a part hereof, wherein like numerals refer to like parts throughout. Not all embodiments provide all of the advantages described above.

Some embodiments of the invention use digital channel driver hardware and a single pole RC filter, the driver hardware and filter capable of transmitting and receiving a multitude of frequencies into a variable impedance sensor where changes to the impedance can be resolved on the digital side of the driver to determine the relative change in impedance.

Some embodiments of the present invention implement a digital to analog drive method with good compatibility to existing field programmable gate array hardware. Further, the drive method in some embodiments is ideally suited towards continuous parallel sampling of the connected sense elements. Further, the drive method in some embodiments is capable of simultaneous driving and sampling the different modes of self-capacitance, mutual capacitance, and receive/pen. Further, the operation of the different modes allows for continuous sampling of self and pen signals even during the mutual capacitance scan.

In one aspect of the present invention, touch sensor driver and receiver circuitry is provided for a multi-touch sensor, the circuitry including: multiple drive/receive circuits adapted to be coupled to respective single row or column electrodes of the multi-touch sensor, each comprising a voltage-following sigma-delta A/D converter combined with a sigma-delta D/A converter having a sigma-delta output filter for driving each respective row or column electrode, the voltage-following A/D converter connected to follow a reference signal on a first reference comparator input by producing a feedback output at a virtual signal node on a second comparator input. The sigma-delta output filter also connected to the virtual signal node. Drive signal generation circuitry is coupled to the reference comparator input of each of the drive/receive circuits, operable to generate a mutual analog sensor signal at a first frequency and a self analog sensor signal at a second frequency different from the first frequency. The mutual analog sensor signal may be coupled to other electrodes by mutual capacitive coupling or another type of mutual coupling. Some of the drive/receive circuits are operable in a first mode to drive both said self and mutual signals simultaneously to their respective electrodes, and to sense said self signal, and others of the drive/receive circuits are operable in a second mode to drive said self signal and sense both said self and mutual signals simultaneously from their respective electrodes. In some implementations, the circuitry includes digital filter and demodulation circuitry operable to separate and filter the simultaneously sensed mutual and self signals. The drive and receive circuits may further be operable in a mode to, in addition to their other functions, simultaneously sense a third pen analog sensor signal at a third frequency different from the first and second frequencies, and the digital filter circuitry is further operable to separate and filter the simultaneously sensed pen analog sensor signal.

In some implementations, the respective drive/receive circuits include one or more digital input pins of an FPGA device and one or more digital output pins of the FPGA device, with an end analog filter connected to one of the one or more output pins, for removing high frequency components and driving an analog voltage signal to its respective row or column electrode. A digital portion of the drive/receive circuit is adapted to measure changes in the sensed driven signal caused by changes in the row or column electrode impedance via measuring internal changes in the digital portion of the drive circuit as it changes an output drive signal forcing the output to follow an input reference available to a digital input. Several different versions are possible using different numbers of FPGA pins per channel; these may be done on ASICs as well but an ASIC would typically employ a one-pin solution. A 4-pin, FPGA version of the respective drive/receive circuits may include: an FPGA output pin for carrying the reference signal connected to a first analog filter together forming a sigma-delta D/A converter adapted to provide an analog reference signal; an FPGA output pin configured to act as a sigma-delta A/D feedback pin connected to the virtual signal node; and two differential FPGA input pins, one connected to the first analog filter output and the other connected to the virtual signal node. A three-pin, FPGA version of the respective drive/receive circuits may include: an FPGA output pin configured to act as a sigma-delta A/D feedback pin; and two differential FPGA input pins, one connected to a common analog reference signal and the other connected to the virtual signal node. A two-pin, FPGA version of the respective drive/receive circuits may include: an FPGA output pin configured to act as a sigma-delta A/D feedback pin; an FPGA input pin to the virtual signal node, and having an internal reference voltage of the pin receiver connected to a common analog reference signal. Also, a 1-pin version of the design may be constructed in which respective drive/receive circuits each comprise FPGA or ASIC circuitry connected to a single pin coupled to the respective row or column electrode, and external analog filter components coupled to the single pin.

In some implementations, the circuitry further includes digital modulation circuitry configured for modulating the self sensor signals for rejecting continuous interfering signals at the first frequency. The circuitry may reject common mode noise by being adapted to subtract the common-mode proportional noise based on the simultaneously sensed self and mutual signals.

In some implementations of the circuitry, the voltage-following sigma-delta A/D converter is constructed with the comparator inputs comprising a differential digital input circuit connected to two integrated circuit pins.

In another aspect of the invention, a method is provided for driving and receiving signals to and from a multi-touch sensor, the method including: (a) for each of a first group of electrodes comprising row or column electrodes of the multi-touch sensor, sequentially scanning a mutual analog sensor signal through the group of electrodes by feeding it to respective sigma-delta D/A converters connected to the respective electrodes, the mutual analog sensor signal comprising a first frequency; (b) while performing (a), for each of a second group of electrodes comprising row electrodes or column electrodes of the multi-touch sensor, simultaneously driving a self analog sensor signal through a sigma-delta DIA converter onto pins coupled to the respective row electrodes or column electrodes, the respective self analog sensor signals comprising a second frequency or a data pattern modulated at a second frequency; and (c) for each of the second group of electrodes used in (b), simultaneously sampling touch sensor data for at least two different modes of self and mutual, the touch sensor data comprising sensed altered sensor signals at the first and second frequencies, altered by the impedance of the row or column electrodes.

In some implementations, of this method, the simultaneous sampling is performed by a voltage following sigma delta AID converter integrated with each sigma-delta D/A converter driving the respective row or column electrodes, the voltage following AID converter having a comparator with a first reference comparator input and a second comparator input, the first reference comparator input receiving the self analog sensor signal and the second comparator input connected to the sigma-delta DIA converter output.

In some implementations of this method, a pen is sensed by performing as part of step (c) for each of the first group of electrodes and the second group of electrodes, simultaneously sampling a third pen analog sensor signal a third transmitted from a pen at a third frequency different from the first and second frequencies.

In some implementations, the method further includes (d) for each of the rows or columns that are not driven in (b) with the mutual analog sensor signal, scanning a second mutual analog sensor signal sequentially through respective sigma-delta DIA converters onto pins coupled to the respective row or column electrodes, the second mutual analog sensor signal comprising a fourth frequency different from the first and second frequencies and different from a third pen frequency if a pen frequency is employed in the method; and (e) for each of the rows or columns that are driven in (b), simultaneously sampling touch sensor data for at least two different modes of self and mutual, the touch sensor data comprising received altered sensor signals at the second and fourth frequencies. In some implementations, the self analog sensor signals comprise a carrier wave modulated with a 50% duty cycle digital signal for rejecting continuous interfering signals at the first frequency. The method may further include subtracting common-mode proportional noise based on the simultaneously sampled self and mutual touch sensor data.

In some implementations, the method may also include adjusting the frequency of the self analog sensor signals or the mutual analog sensor signals by controlling a digital frequency generator. The self analog sensor signal, mutual analog sensor signal, and pen analog sensor signal may include multiple frequencies, which are typically grouped for each signal for ease of demodulation. In the case of the pen, multiple frequencies may be transmitted into the sensor array from multiple pen electrodes and received in the manner described herein.

In another aspect of the invention, a method is provided for driving and receiving signals to and from a multi-touch sensor, the method including: (a) for each of a first group of electrodes comprising row or column electrodes of the multi-touch sensor, sequentially scanning a mutual analog sensor signal through the group of electrodes by feeding it to respective sigma-delta DIA converters connected to the respective electrodes, the mutual analog sensor signal including one or more first frequencies; (b) for each of a second group of electrodes comprising row electrodes or column electrodes of the multi-touch sensor sensing touch sensor mutual data, the touch sensor mutual data comprising sensed altered sensor signals at the one or more first frequencies, altered by coupling between the row and column electrodes; (c) simultaneously to the sensing of (b) for each of the second group of electrodes, simultaneously sampling a pen analog sensor signal transmitted from a pen at one or more pen frequencies different from the first frequencies using the same AID converter performing the sensing of (b). The pen signaling may include multiple electrodes transmitting multiple signals from the pen on different frequencies, which is referred to as one or more pen frequencies to identify that a single pen frequency may be used or many.

In some implementations of this method, the simultaneous sampling is performed by a voltage following sigma-delta A/D converter integrated with each sigma-delta D/A converter driving the respective row or column electrodes, the voltage following AID converter having a comparator with a first reference comparator input and a second comparator input, the second comparator input being connected to the sigma-delta DIA converter output.

In another aspect of the invention, a drive/receive circuit is provided which is adapted to be coupled to a single row or column electrodes of a multi-touch sensor, the circuit including a voltage-following sigma-delta AID converter combined with a sigma-delta D/A converter having a sigma-delta output filter for driving the row or column electrode, the voltage-following AID converter connected to follow a reference signal on a first reference comparator input by producing a feedback output at a virtual signal node on a second comparator input, the sigma-delta output filter also connected to the virtual signal node. Also included is drive signal generation circuitry coupled to the reference comparator input of the drive/receive circuit, and operable to generate a mutual analog sensor signal at a first frequency and a self analog sensor signal at a second frequency different from the first frequency. The drive/receive circuit is operable in a first mode to drive a mutual signal to the electrode, and operable in a second mode to sense said mutual signal from the electrode.

In some implementations, the drive signal generation circuitry is further operable in the first mode to simultaneously generate a self analog sensor signal at a second frequency different from the first frequency, and to simultaneously sense said self signal. In some implementations, the same self-sensing scheme may be provided in the second mode. The drive signal generation circuitry may also be further operable in both modes to simultaneously sense a third pen analog sensor signal at a third frequency different from the first and second frequencies. In some implementations, the circuit may further include digital filter circuitry and demodulation circuitry further operable to separate and filter the simultaneously sensed pen analog sensor signal. In various aspects of the present invention, the following features are provided that may be employed alone or in combination to achieve improved touch sensor circuits, systems, and methods.

A multi-touch sensor and electrostatic digitizing pen system is provided comprising a flexible programmable logic block and driver circuit embedded in a semiconductor utilizing a method of simultaneous transmit and receives, simultaneously on a plurality of channels with a simultaneous plurality of frequencies resulting in vastly improved performance.

A multi-touch system is provided for one or more of improving speed, efficiency, transceiver channel separation, and noise rejection, through the use of simultaneous and continuous sampling of multiple channels at multiple frequencies to enable heretofore independently operated touchscreen modes to be operated now concurrently.

Multi-touch system drive channels are provided capable of simultaneous multiple modes such as self-capacitance, mutual capacitance transmit or receive, and receive, using a digital input or using a digital input with analog capable reference, or analog comparator type input with internal logic, analog filter components, pulse width modulation logic, digital filter components, modulation and demodulation logic, and dither logic; comprising a voltage following Sigma Delta Analog to Digital Converter drive.

A multi-touch system is provided that is capable of a plurality of sensors and sensor types through configuration of the drive modulation and demodulation scheme which is not limited to single frequencies or channels and can therefore be configured to match characteristics of different types of hardware such as projected capacitance touchscreens, electrostatic pens, resistive touchscreens, pressure sensitive touchscreens, strain gauge touchscreens, or any sensor requiring a drive signal where impedance changes to the sensor are measured to determine sensor action.

A multi-touch system is provided capable of receiving an externally generated signal at some frequency and demodulating signals on said incoming frequency with Phase Shift Keying (PSK), Frequency Shift Keying (FSK), Quadrature Amplitude Modulation (QAM) or other demodulation scheme during independent read only mode or simultaneously with other sampling and driving modes.

A multi-touch system is provided capable of single axis or dual axis mutual capacitive scanning mode operation during independent mutual capacitive mode or simultaneously with other sampling and driving modes.

A multi-touch system is provided with improved self-capacitance mode acquisition for improved conductive contaminant (salt water rejection) identification and rejection, and improved spatial projection distance via simultaneous drive and measurement of all touchscreen channels thus forcing the change in signal due to touch coupling to be via the users ground path and not through changes in channel to channel touchscreen impedance changes.

A multi-touch system is provided with improved sample resolution via use of noise shaped dither in combination with the continuous low frequency and low amplitude self-capacitive signal used as the reference or as part of the reference to overcome hysteresis and quantization on the self-capacitance mode signals as well for other signals of interest concurrently in operation at the time such as the mutual capacitance receive and or pen receive signals.

A multi-touch system is provided that generates and uses dither signals capable of using a shared bit rolled dither: a single dither signal shared between all channels with or without a delay difference between channels: to randomize dither noise across system channels enhancing dither noise randomization and smoothing of energy across channels or to synchronize dither noise across system channels to enhance simultaneous noise rejection by keeping all channels as similar as possible.

A multi-touch system is provided using all digital processing and drive channels utilizing one or more digital output pins and one or more digital input pins with an end analog filter on the output pin to remove high frequency components thereby enabling an analog voltage signal to drive a sensor where the sensor has some impedance change that affects the signal's properties such as phase, amplitude, frequency, or offset voltage and the change can be measured via the internal changes in the digital portion of the drive circuit as it changes the output drive signals forcing the output to follow an input reference available to the digital input which may be comprised of stationary or changing signals.

A multi-touch system is provided using all digital processing and drive channels utilizing one or more digital output pins and or one or more analog comparator input pins with an end analog filter on the output pin to remove high frequency components thereby enabling an analog voltage signal to drive a sensor where the sensor has some impedance change that affects the signal's properties such as phase, amplitude, frequency, or offset voltage and the change can be measured via the internal changes in the digital portion of the drive circuit as it changes the output drive signals forcing the output to follow an input reference available to the analog input which may be comprised of stationary or changing signals.

A multi-touch system is provided where most or all of the digital and analog circuitry is internal to the silicon using a single pin to connect to the sensor channel.

A multi-touch multi sensor system is provided using substantially parallel simultaneously active drive circuitry and system logic that can be implemented and made operable in present day field programmable gate array hardware.

A method is provided for synchronous modulation demodulation on a touch screen system using PSK, FSK, or other advanced modulation schemes where phase and or frequency changes are incorporated into the modulation of the output signal and also then to the demodulation of the input stream to achieve a final demodulated coherent synchronous signal with enhanced same frequency rejection.

A method is provided for synchronous modulation demodulation on a touch screen system using sweeping, hopping, chirp, or any changing signal pattern incorporated into the modulation of the output signal and also then to the demodulation of the input stream to achieve a final demodulation coherent synchronous signal with enhanced frequency rejection.

A method is provided for identification and removal of noise using the simultaneous sampling properties of the parallel channel drivers and concurrent mode properties of the system.

In some versions, the touch sensor itself is included with the invention, while in others the drive and receive circuitry and methods may be embodied in a touch sensor controller chip or other integrated chip (IC) for interfacing with a touch sensor such as those used with touchscreens on smartphones, tablets, notebook PCs, point-of-sale kiosks, touch sensitive fabric, touch sensitive surfaces, drawing pads or pen input pads, and other any other touch sensor array products. Further, the drive/receive circuits disclosed herein may be used with non-array sensors such as touch sensitive buttons or other sensors, however touch sensor arrays is the most beneficial application. In some versions, the circuitry and method may be embodied in IC design cores such as VHDL or other FPGA or ASIC licensed intellectual property cores. In such cases, the invention is embodied in the computer readable instructions executable to program a hardware device to embody the integrated circuit designs described herein, or to embody integrated circuit designs for performing the methods herein. In other words, the scope of this patent cannot be avoided merely by preparing and making, using, selling, or importing an intellectual property design core that embodies the designs or methods herein. Each of the designs and processes below may be embodied in a combination of circuit design information or executable code to be executable by a controller in combination with such a circuit.

BRIEF DESCRIPTION OF THE SEVERAL VIEWS OF THE DRAWING(S)

FIG. 2 is a supporting legend for FIGS. 2-6 and FIGS. 15-16.

FIGS. 20-23 show prior art circuits discussed in the background.

DETAILED DESCRIPTION OF EXAMPLE EMBODIMENTS

Novel features believed to be characteristic of the various inventions, together with further advantages thereof, will be better understood from the following description considered in connection with the accompanying drawings in which preferred embodiments of the present invention is illustrated by way of example. It is to be expressly understood, however, that the drawings are for the purpose of illustration and description only and are not intended to define the limits of the invention.

Figure 1:
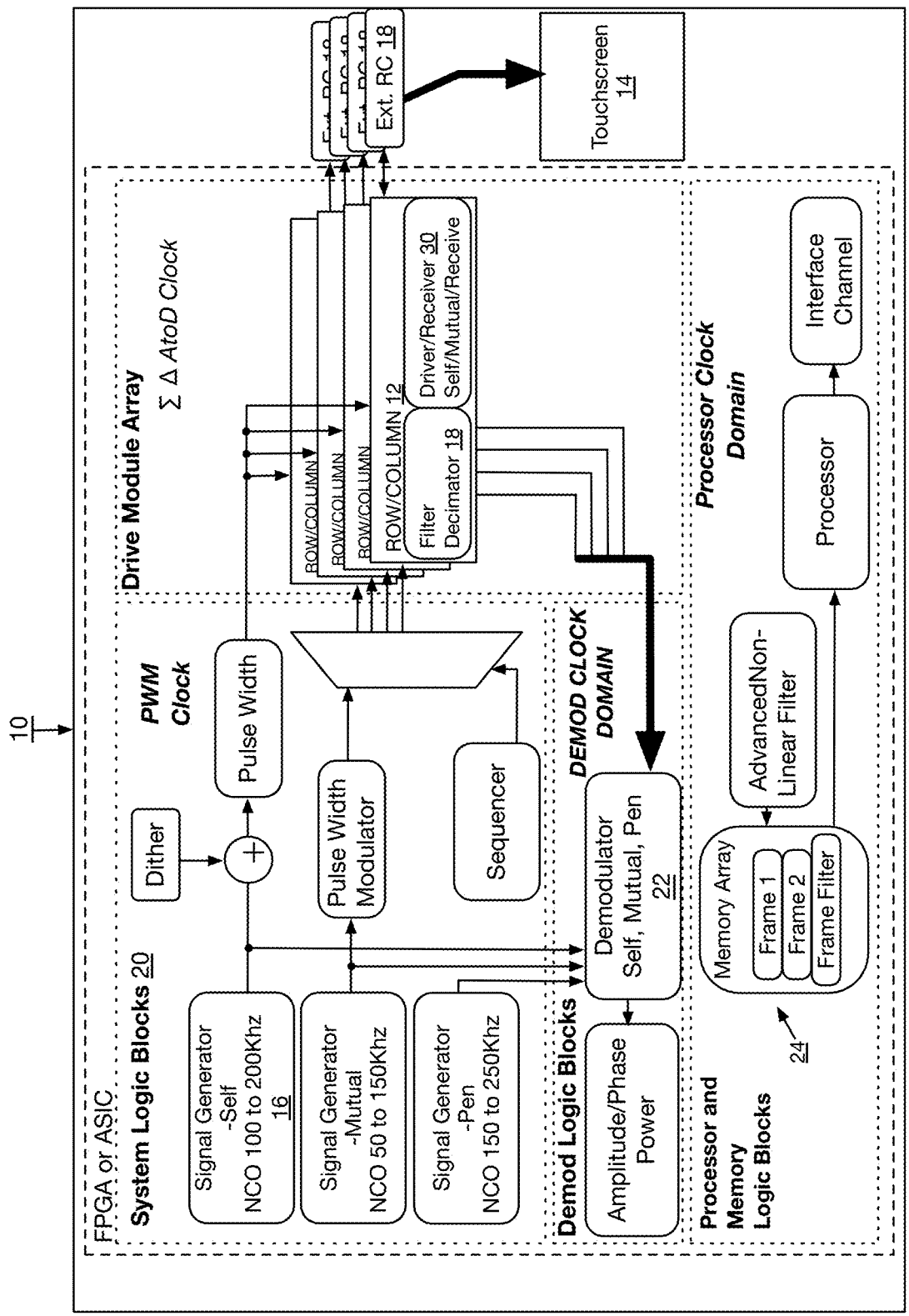
FIG. 1 is a block diagram of an embodiment of a touchscreen control system including touchscreen drive and receive circuitry built with digital configured to transmit or receive multiple modes simultaneously.

FIG. 1 is a block diagram of an embodiment of a touchscreen control system including touchscreen drive and receive circuitry 10 constructed with flexible programmable logic embedded in a semiconductor device which may be a touchscreen controller chip, or may be integrated into a larger system on chip arrangement with other system functionality as well. Typically, the circuitry appears in touchscreen or other touch sensor controller circuitry. The circuitry 10 transmits and receives simultaneously on a plurality of channels 12 to drive analog sensor signals through channel drivers 30 to the electrodes of a multi-touch sensor 14. The electrodes typically include row and column electrodes arranged in a grid, but may include other non-symmetrical arrangements of electrodes, multiple grids, or other suitable arrangements of electrodes that can cross-couple signals in response to touch or proximity. The analog sensor signals are driven at a plurality of simultaneous frequencies 16 in accordance with some embodiments of the present invention. While four channel drivers are shown in the drawing, this is to illustrate a plurality, and the preferred versions will have as many channels as there are touchscreen electrodes (rows and columns), with repeated instantiations of the drive module, including drive circuitry and receiving filters, for each channel. The diagram generally shows the digital clock domains and their functionality, the Drive Module Array, the System Logic Blocks, the Demod Logic Blocks, and the Processor and Memory Logic Blocks. The processor also includes program memory for storing executable program code to control and direct the various digital logic and digital signal processing functions described herein.

As can be seen in the diagram of FIG. 1, the system touchscreen driver and sensor circuitry can be embodied in an FPGA or ASIC. Some embodiments provide a multitouch system FIG. 1 with flexible configuration. Some embodiments provide a multi-touch system capable of operating almost exclusively in the digital realm, as described below, meaning that an FPGA or other reconfigurable or programmable logic device (PLD) may be employed to construct almost the entire circuit, without the need for op amps or other active external analog components, beyond the driver circuitry included in the FPGA or PLD. External resistors and capacitors 18 are all that are needed to supplement the digital I/O circuits of an FPGA to achieve the channel drive/receive circuits in preferred embodiments. This is because of the unique use of sigma-delta converter combinations that allow the digital I/O pins to act in a way similar to analog sensor drivers. Some embodiments provide system implementation and operation in programmable logic or custom silicon.

The other parts of the system block diagram of FIG. 1 include, generally, the lowpass filter/decimator block 18 that filters the incoming sensed signals, the system logic blocks 20, the demodulation logic blocks 22, and the processor and memory logic blocks 24, which will all be further described below. Most of the benefits of the improved touch sensor driving circuitry and control schemes come from the design of the drive/receive circuit itself, and the use of it to drive and receive different types of signals in a flexible and reconfigurable manner. Preferably the drive/receive circuitry driving the various touch sensor electrode channels is embodied in a digital device and drives and receives signals using digital I/O drivers and receivers, but in some versions analog amplifiers or other analog components may be employed with the signaling schemes described herein. This design may be referred to herein as a "digital channel driver 30", "channel driver 30," and "drive/receive circuit 30." Several variations of the channel driver will be described below, followed by a description of several unique and beneficial signaling and measurement schemes that advance the ability to accurately measure touch on many types of touch sensors.

The Digital Channel Driver:

Some embodiments of the invention use digital channel driver hardware and a single pole RC filter capable of transmitting and receiving a multitude of frequencies into a variable impedance sensor where changes to the impedance can be resolved on the digital side of the driver to determine the relative change in impedance from each sensor electrode.

Such impedance changes may manifest in several ways. A change of capacitance in a floating sensor system, when driven by a sine wave, will present as a phase change. A change in resistance in a floating sensor system will also cause a phase change, finally a resistance load change in a resistive sensor system will cause a DC offset change. These changes are changes between the generated reference signal (AC and/or DC) and the generated analog feedback signal which is an averaged representation of the digital stream of "higher/lower" signals from the 1-bit ADC.

Some embodiments employ said channel drivers to interface to multiple types of sensors such as projected capacitance touchscreens, resistive touchscreens, pressure sensitive touchscreens, strain-gauge array touchscreens, etc.

Some embodiments of the invention use said channel drivers in a parallel manner to drive touchscreens 14 or other touch sensor arrays with signal combinations allowing multiple mode simultaneous touchscreen sampling (self, mutual, and receive). Such ability requires the channel driver to be capable of a minimum of transmitting a single continuous frequency (self), transmitting an intermittent frequency (mutual TX), receiving a frequency (mutual RX), and receiving pen frequencies all through a single Delta Sigma Driver at the same instance and also handling the filter, decimation, and demodulation. Typically, these signals are generated and mixed, or generated directly, or generated and channeled, then sent into the reference of the Sigma Delta 1-bit ADC.

Figure 19:
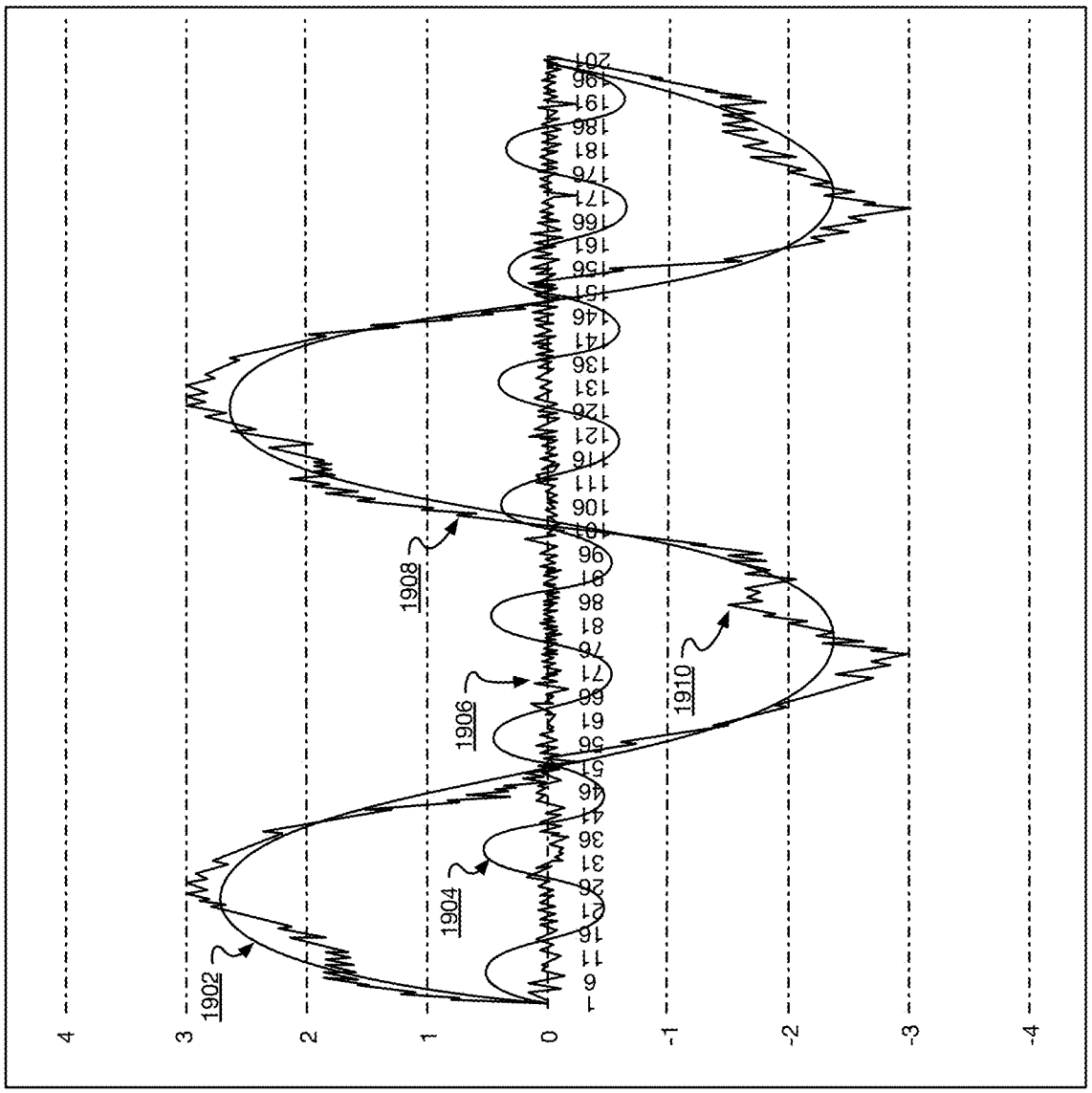
FIG. 19 is a simple simulated example of the drive channel signals showing the drive, dither, and voltage following (sensed) signals.
Figure 20:
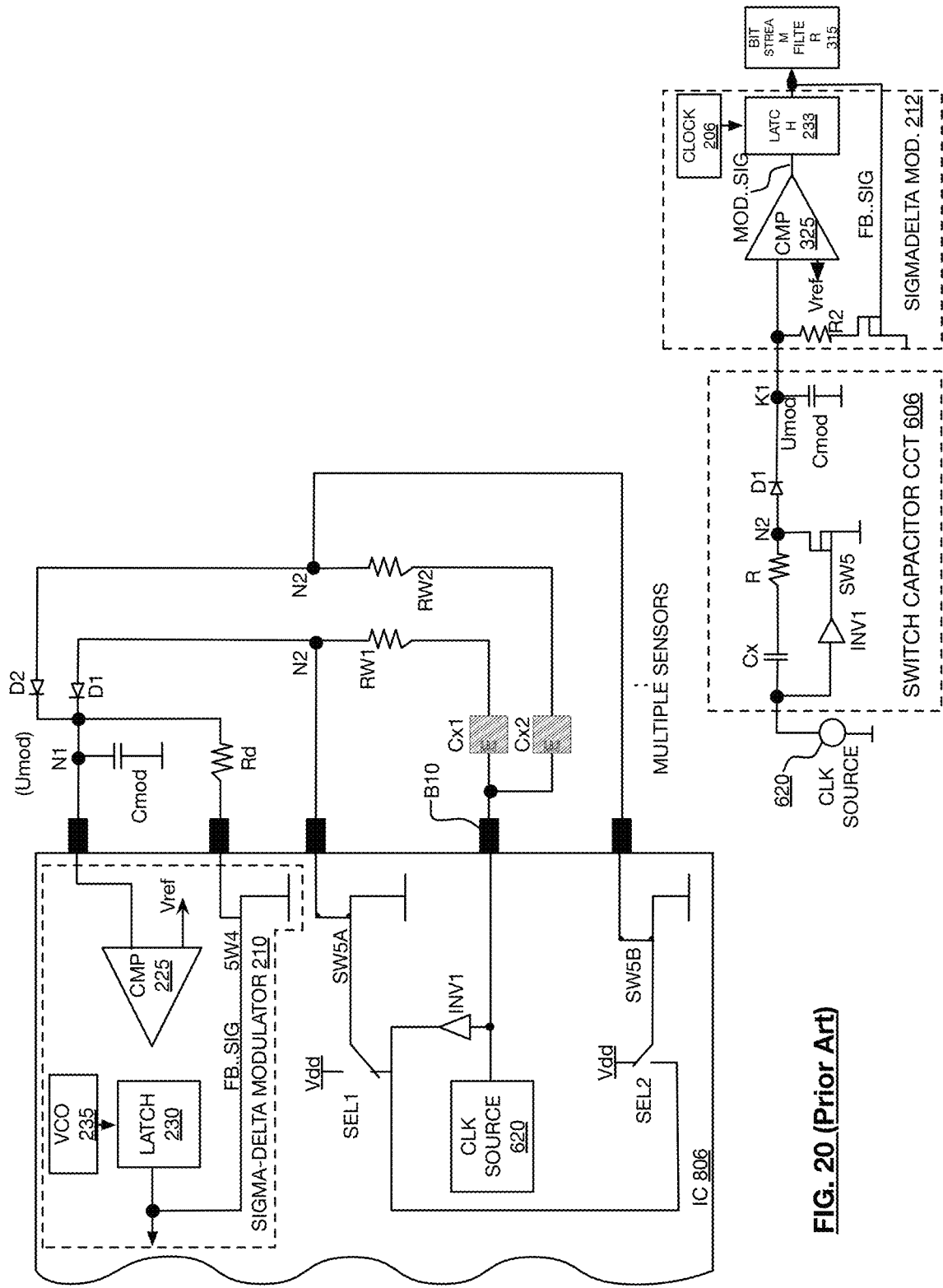

Some embodiments of the invention use said parallel channel drivers with dither signals combined with a low amplitude self-capacitance mode signal to overcome input hysteresis of the digital I/O pins employed in the drive/receive circuits 30, and allow continuous self-capacitive mode signal sampling and associated signal processing improvements, such as that described with respect to FIG. 19. By using a low frequency continuous working signal (the self-capacitance signal) that drive the one-bit digital ADC above and below its hysteresis band, the requirement for lower amplitude high frequency noise dithering is reduced for the signals received on the channel (mutual RX and Pen-generated analog sensor signals).

Some embodiments of the invention employ said parallel channel drivers to provide a capability of improved conductive contaminant (such as, for example, salt water) rejection through the self-capacitive mode method of driving all channels simultaneously to eliminate unwanted impedance paths from channel to channel allowing only impedance changes due to the user's touch and ground path.

The operation of the self-capacitance mode with all channels driven simultaneously allows for almost ideal self-capacitive salt water rejection operation due to the fact that the change to variable impedance paths happen through the users touch to ground only and changes to the impedance paths back to the touchscreen are almost zeroed. This is as close as a continuous plane driven at the frequency of interest, as possible.

Figure 7:
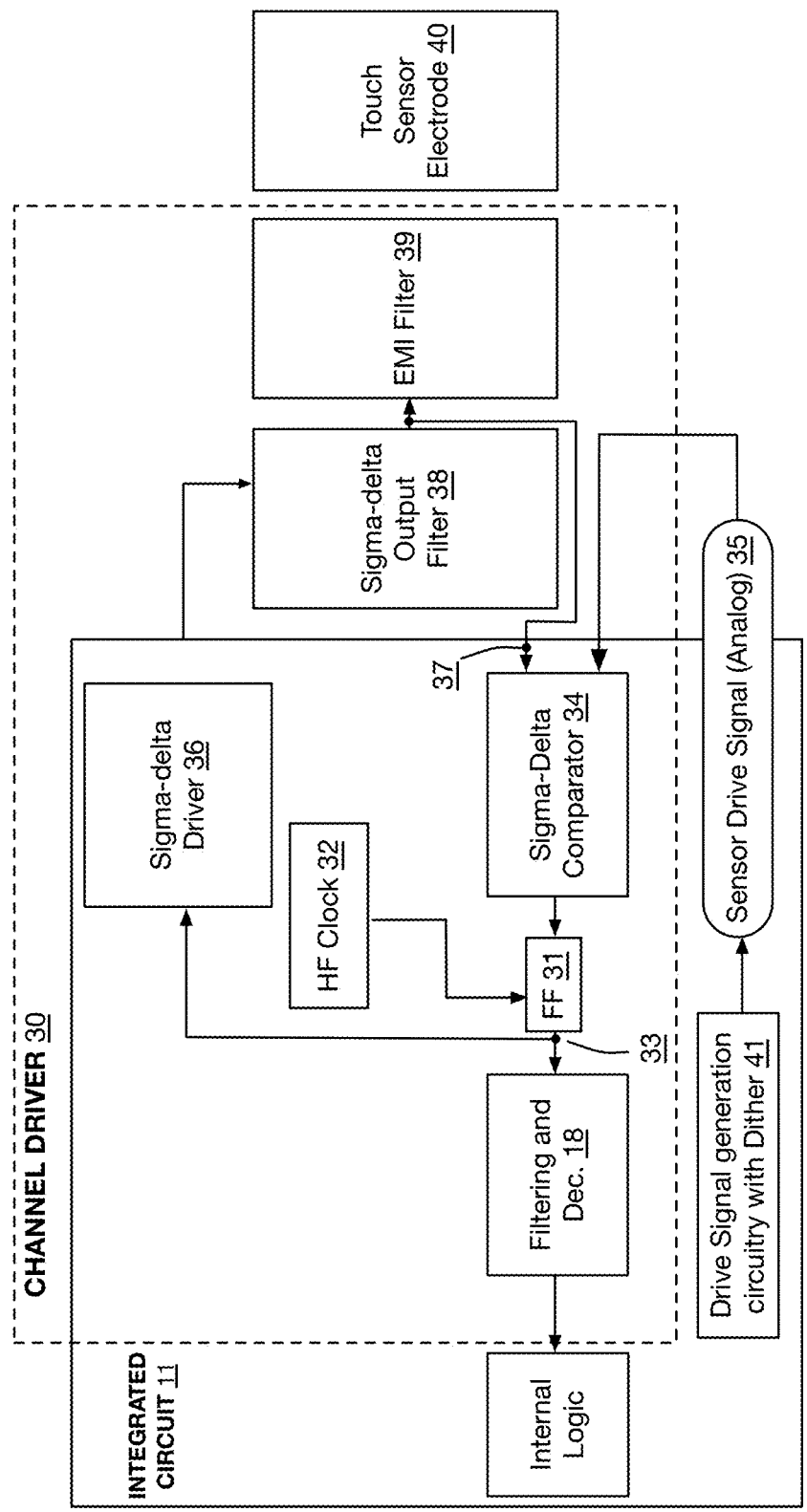
FIG. 7 is a block diagram of a channel driver and receiver circuit according to some embodiments of the invention.

FIG. 7 is a circuit block diagram of drive/receive circuitry for a channel driver according to some embodiments. Some embodiments of the invention use a hardware array of one or more channel drivers 30, as depicted generally by the components in the dotted line numbered 30, to drive and receive analog sensor signals to a sensor. Each channel driver 30 generally includes a novel voltage following sigma-delta A/D converter that includes: a sigma delta D/A converter comprised of a sigma delta driver 36 driving a digital output to which is connected a sigma-delta output filter 38, which typically an analog single pole RC filter. The A/D converter portion of the circuit is implemented with a sigma-delta comparator 34 having two inputs, one connected to the sigma-delta output filter node which drives the touch sensor electrode 40. A second EMI filter 39 may also be used to filter high frequency noise at the electrode 40.

The other input of the sigma-delta comparator, the reference input, is connected to an analog sensor drive signal 35, which contains the one or more analog frequencies (which may be modulated signals) employed to drive the touch sensor in various modes as discussed below. Sensor drive signal 35 is shown bridging the integrated circuit 11 and the external components because, while the signal is typically generated on the integrated circuit in digital form, it may be driven outside through D/A outputs in some versions, or it may be fed into the integrated circuit as a reference voltage where system design allows, as will be further discussed with respect to various versions of the circuit below. The sensor drive signal in this version is generated by drive signal generation circuitry 41. This typically includes, as further described below, digital frequency generating, and mixing the digital signals in cases where multiple signals are transmitted simultaneously. Referring now this version of the analog sensor drive signal 35, this signal produced by drive signal generation circuitry 41 feeding the reference of each of the drive/receive circuits 30, and operable to generate a mutual sensor signal (or "mutual signal") at a first frequency and a self sensor signal (or "self signal") at a second frequency different from the first frequency. The self and mutual sensor signals driving the electrodes for detecting self (same electrode) impedance changes and mutual (cross coupled from other electrodes) impedance changes are first generated digitally at respective frequency generators, which preferably generate sine waves at the respective frequencies f1 and f2, but may generate other continuously varying signals such as wavelet sequences, modulated waves, or other analog varying patterns. While generally the various signals are discussed as being at specific frequencies, they may also be a group of sub-signals carried on a set of frequencies, which will be driven together, or transmitted together in the case of the pen signal. The pen signal may include multiple electrodes transmitting multiple signals from the pen on different frequencies, which is referred to as one or more pen frequencies to identify that a single pen frequency may be used or many. Dither is also added for the reasons discussed herein. It is noted that one special case of this circuit is when the self analog sensor signal is not used, and the circuit is employed only to receive a pen analog sensor signal on a third frequency, and to transmit the mutual analog sensor signal and, at other nodes, to receive the mutual analog sensor signal. In such case, the dither is still added to the mutual analog sensor signal. As shown, the analog sensor drive signal 35 is connected to the second comparator input, which functions as a voltage follower due to the feedback connection of the sigma-delta driver 36 to the first comparator 34 input at node 37. This connection enables the drive/receive circuit 30 to act as a sigma-delta analog to digital transceiver. That is, circuit 30 both drives the signal present on reference 35 out through the sigma-delta driver portion, and to sense or receive the driven signal changes needed to follow the reference 35—which indicate the impedance changes caused by touch on the touch circuitry, or signal or noise external to the electrode, such as the mutual analog sensor signal and the pen sensor signal(s). The feedback connection at node 37 causes this node to act as a "virtual signal" node, which the entire voltage following A/D converter attempts to match to analog sensor drive signal 35. Because the impedance of touch sensor electrode 40 changes when touched based on capacitance, inductance, or resistance changes, the signal at virtual signal node 37 contains variations indicating such changes, as the sigma-delta D/A converter portion of the circuit drives more or less voltage to node 37 to keep up with the impedance changes. These changes are present in the comparator output signal at node 33, which is filtered and decimated to a lower digital sample rate at block 18, for processing by the system internal logic, such as that shown in FIG. 1, to detect and process the various touch and pen inputs. The voltage follower circuit also works to detect signals coupled into the sensor electrode 40, such as analog signals generated from a touchscreen pen, or mutual-coupled signals driven on other touch sensor electrodes and coupled into the electrode detecting the signal. The depicted circuit is therefore adapted to drive one or more analog signals, and sense one or more analog signals, at the same time by mixing the desired sensor signals to be driven into sensor drive signal 35, as will be further described below.

While a sigma-delta based channel drive/receive circuit is shown here in the preferred version to employ only digital I/O pins and not require analog op amps or analog A/D and D/A converters or switches, this is not limiting and other versions may employ such analog components, both on and off the integrated circuit. For example, the A/D converter portion of the circuit may be comprised of a digital input with an AC capable generated reference threshold or an analog comparator with one input accepting an AC capable generated reference.

Recently, much work on sigma-delta A/D converters has been done with the goal of producing a high frequency high resolution solution capable of replacing the more standard analog versions of A/D converters such as successive-approximation, integrating, and Wilkinson ADC. Much work has been directed towards accuracy and improvements in linearity. In the present invention resolution, speed, and repeatability are the key features required for successful touchscreen function. Standing alone, a simple Sigma Delta ADC, without accuracy and linearity, will find very few applications. Coupled to the concurrent driving modes and simultaneous sampling of the present invention as well as internal calibration of the touch system, these and other limitations of the sigma-delta ADC become trivial issues to the system operation. The sigma-delta driver and sensor designs herein are much less sensitive to nonlinearity, low input impedance, and accuracy issues than typical applications of such ADC designs.

As employed in some embodiments herein, the touchscreen driver and receiver circuitry includes a hardware array of channel drivers 30 such as that of FIG. 7, with internal logic operating on a high frequency clock 32. The digital input and output logic if allowed to run free could switch and oscillate up to the capabilities of the silicon hardware possibly producing very high unwanted frequencies. The loop is controlled and limited to a known frequency via the clocked flip-flop 31 which is set to a speed compatible with the silicon hardware and of a value favorable to external filtering and internal resolution.

Some versions of the touchscreen driver and receiver circuitry herein also include a hardware array of channel drivers utilizing a filter and decimation chain to move the data from the high frequency low resolution realm of the one-bit sigma delta A/D converter to the low frequency high resolution realm of function needed for further signal processing.

Figure 11:
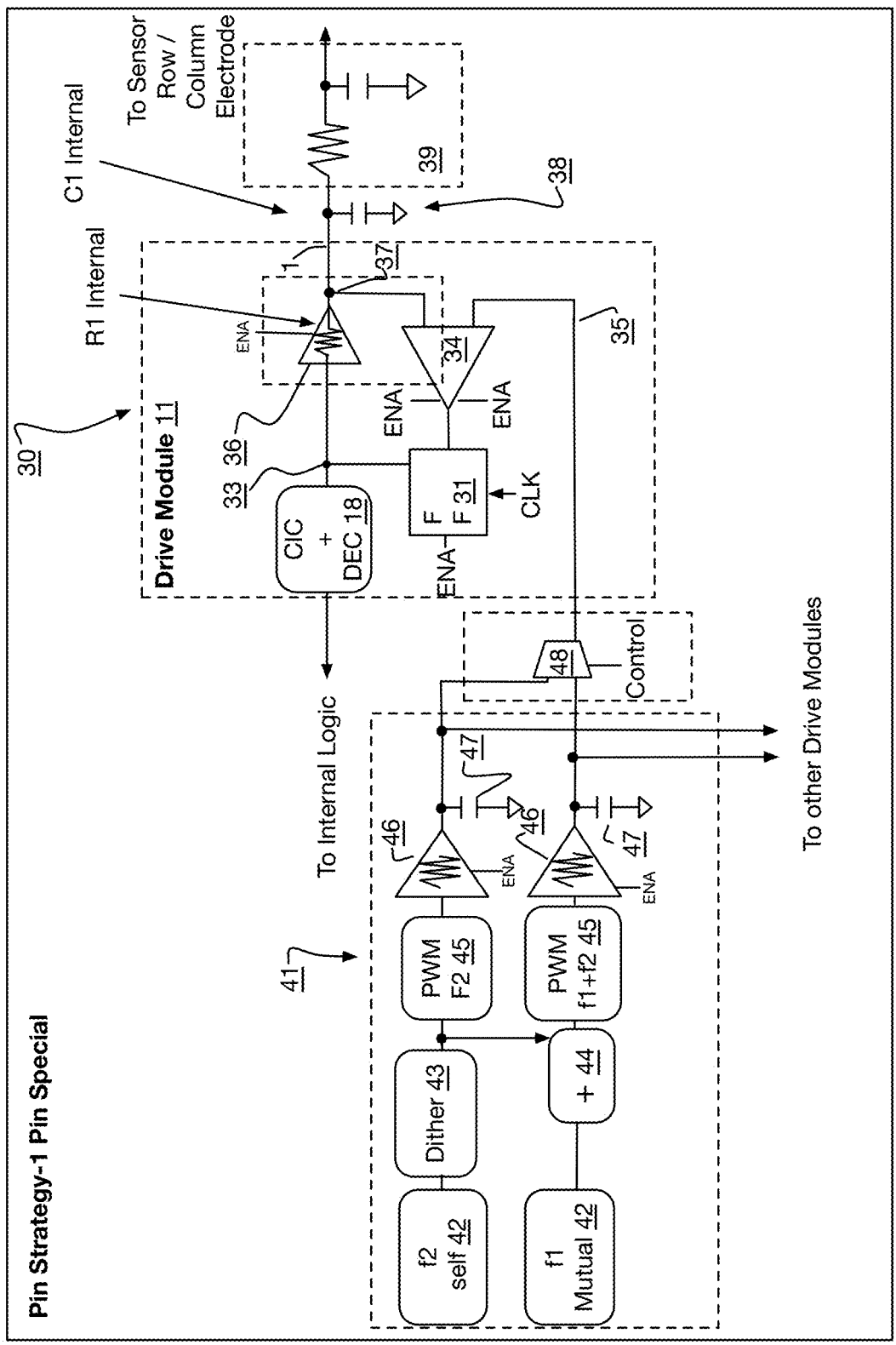
FIG. 11 is a schematic diagram showing an embodiment of a drive/receive circuit in a 1-pin configuration of programmable logic with special requirements.

FIG. 11 is a schematic diagram showing an embodiment of the circuit of FIG. 7, implemented using one pin of a programmable logic device, with special requirements that may require customization of present generation of programmable logic I/O circuitry. The preferred embodiment of the channel driver depicted in FIG. 11 uses a single pin, labeled 1, per channel and functions without any limitation as to the mutual transmit mode as discussed herein, but may require custom silicon at the present time due to the need for internal analog channels, analog switches, output and input buffer simultaneous function, and also higher digital buffer output impedance settings more in line with use with smaller output filter capacitance C1. Current output buffer impedance near the range of <1000 ohms where 5 k to 10 k ohm would allow much smaller C1 values. For FPGA solutions that provide such features, only custom configuration, and not custom circuit modification, are required to achieve the depicted design.

The depicted circuit includes a channel driver and receiver circuitry 30, with the internal or onboard portions of circuitry 30 (on the IC) identified by block 11, and the sigma-delta output filter 38 implemented with an internal resistor R1, and an external capacitor C1. The portion labeled "Drive Module" represents the internal portions of the drive channel circuit, which are repeated for each channel. The EMI filter 39 is implemented with external resistors and capacitors as shown. EMI filter 39, in this example, is a lowpass RC filter with a cutoff frequency of approximately 1 Mhz. Filter 39 functions to reduce the outgoing noise from dither, the PWM signal noise, and clock EMI that may emanate from channel driver 30. It also functions to reduce EMI (electromagnetic interference) from the sensor electrode, and to reduce ESD (electrostatic discharge) noise coming in from the sensor electrode. The sigma-delta driver circuit 36 is implemented with the digital output driver for pin 1, which is connected to both the external portions of the sigma-delta filter, and connected back to the voltage following A/D circuit input. The voltage following sigma-delta A/D circuit includes comparator 34, which in this embodiment is implemented with the comparative input receiver of the built-in drive receive circuitry of the IC. In this version the comparator of circuit 34 is fed with analog sensor drive signal 35. The comparator 34 output is fed to flip-flop 31, where it is clocked through with the local, high frequency clock signal CLK to control the sampling rate of the signal passed through to the flip-flop 31 output 33. This output 33 carries the high-frequency digital received signal which is passed to the CIC filer and decimator 18, and also fed back to the sigma-delta driver 36 as a feedback signal. Using such feedback to receive the analog signal at virtual signal node 37, while driving the comparator reference input with the analog sensor drive signal 35, provides the voltage following A/D converter is connected to follow a reference signal on a first input by producing a feedback output at a virtual signal node on a second input, the sigma-delta output filter also connected to the virtual signal node 37 to drive the sensor electrode.

The received signal at node 33 is lowpass filtered and decimated to a lower sampling rate at CIC and decimator 18. While a CIC filter is used here, this is not limiting and any suitable lowpass digital filter arrangement may be used. The output of filter and decimator 18 is fed to the demodulation logic blocks (FIG. 1), where it is processed and interpreted to detect touch inputs on the touch sensor electrodes.

Referring now to the analog sensor drive signal 35, this signal is produced by drive signal generation circuitry 41 feeding the reference of each of the drive/receive circuits 30 operable to generate a mutual sensor signal (or "mutual signal") at a first frequency and a self sensor signal (or "self signal") at a second frequency different from the first frequency.

The self and mutual sensor signals driving the electrodes for detecting self (same electrode) impedance changes and mutual (cross coupled from other electrodes) impedance changes are first generated digitally at respective frequency generators 42, which preferably generate sine waves at the respective frequencies f1 and f2, but may generate other continuously varying signals such as wavelet sequences, modulated waves, or other analog varying patterns. For example, one or more of the f1, f2 and f3 signals may include a groups of frequencies, such as three sine wave frequencies, in which the received magnitudes are accumulated together after demodulation. Frequency sweeping, hopping, or chirping methods may also be used with the analog signals of the f2, f1, and f3 (Self, Mutual, Pen) measurements. Prior art techniques that employ square waves for the sensor signals are generally not the best selection for these signals because the square waves contain harmonics which cause deleterious effects when they pass through the sensor electrodes, and the sensor measurement is not available across the entire period of the wave. This version generates sine waves at the f1 and f2 frequencies, which are sufficient different frequencies that they can be easily demodulated separately or separated by filters in the receiver logic portions of the system. The self sensor signal is fed to a dither circuit which adds dither to the signal to improve the resolution and overcome hysteresis issues in the A/D converter portion of circuit 30, as further described below. A common dither may be added to all self sensor signals, or independently generated dithers may be used. The dithered self sensor signal is added to the mutual sensor signal at adder 44. Dither as used herein is the addition of a low magnitude noise signal, typically shaped in the frequency domain to cover a desired bandwidth. The frequency components of the noise are usually selected to be above the final usable system frequency range, and the noise therefore gets filtered out of final readings. Dither noise is often added to A/D systems to improve resolution by breaking up quantization noise (step noise). Herein it is also used to overcome the 1-bit A/D hysteresis by randomly pushing the input voltage below and above the hysteresis band exhibited by the comparator circuit. After dither is added to the signal shown, the two branches are then separated PWM (pulse width modulation) modulated at PWM modulators 45. Then, the PWM signals pass to a sigma-delta D/A converter implemented with a digital output driver 46 (having an internal resistance) and a sigma-delta output capacitor 47. The output of these two D/A converters is then an analog dithered self signal at f2 frequency and a combined analog self and mutual signal having f1 and f2 added. These signals may be routed to feed other channel drive/receive circuits as depicted, to avoid duplicating the signal generation circuitry and to provide drive signals at a common phase. Analog switch or multiplexor 48 provides the ability to control whether the drive/receive circuitry 30 drives both self and mutual signals, or only the self signal at f2. This enables selection of modes and the mutual scanning function described below. The self and dither may be set to zero to provide a pure mutual signal at frequency f1 should the sensing scheme employed with a particular design require only the mutual signal to be driven at some point. It should be noted that while the depicted circuit generates analog versions of both the self and mutual signals, some versions may include a control selection switch feeding only one D/A converter, selecting the mode of f2 or f1+f2 before converting the signal to analog (the version of FIG. 9 has such a design). Each drive/receive module may also generate their own self, mutual, or self and mutual signals, but such a design needlessly replicates the signal generation circuitry. For versions in which separate mutual frequencies are desired for each row, each drive receive circuit 30 may be fed with a separate mutual signal, driven at other frequencies such as f4, f5, f6, . . . fn, up to the number of rows or columns that are used for mutually coupled signal detection. Thus, the full range of driving and receiving schemes discussed herein, including the driving processes of FIG. 6 and FIG. 15 may be applied with this embodiment.

The output of drive signal generation circuitry 41 is the analog sensor drive signal 35, which is fed to the reference input of comparator 34, part of the voltage following sigma-delta A/D converter. This circuit acts both to drive the sensor electrode, which can be done directly or through a filter 39, and to sense changes of the sensor electrode impedance as discussed above. The circuit, and the other versions described herein, can also receive other signals coupled into the sensor electrode, such as mutual signals coupled from other electrodes, or a pen signal coupled directly into the connected electrode by an active pen used with the touch sensor array.

The circuit of FIG. 11 is preferred because it uses fewer output pins, only one per drive/receive channel, and so an array of such circuits driving approximately 100 I/O pins of the integrated circuit may be employed to drive a 50-row by 50-column touch sensor such as a touchscreen, touch pad, or touch sensitive fabric using PEDOT variable resistive electrodes. However, implementing the circuit of FIG. 11 and other 1-pin equivalents thereof on an FPGA platform requires first a comparative input and digital output for each I/O pin employed, second a digital output impedance at driver 36 high enough for the required sigma-delta output filter at C1 (which output impedance is preferably in the range of 1 k Ohms to 10 k Ohms), and third, control over the analog voltage references (feeding the vref of input comparators) and other analog components such as analog switches. Some present FPGA products may allow such control, while others do not. Therefore, a custom ASIC or a customized FPGA product is needed in some cases to achieve the circuit of FIG. 11. The different transmit receive modes herein, including those of FIG. 3, FIG. 4, FIG. 5, FIG. 6 and FIG. 15 may be applied with this embodiment.

Figure 10:
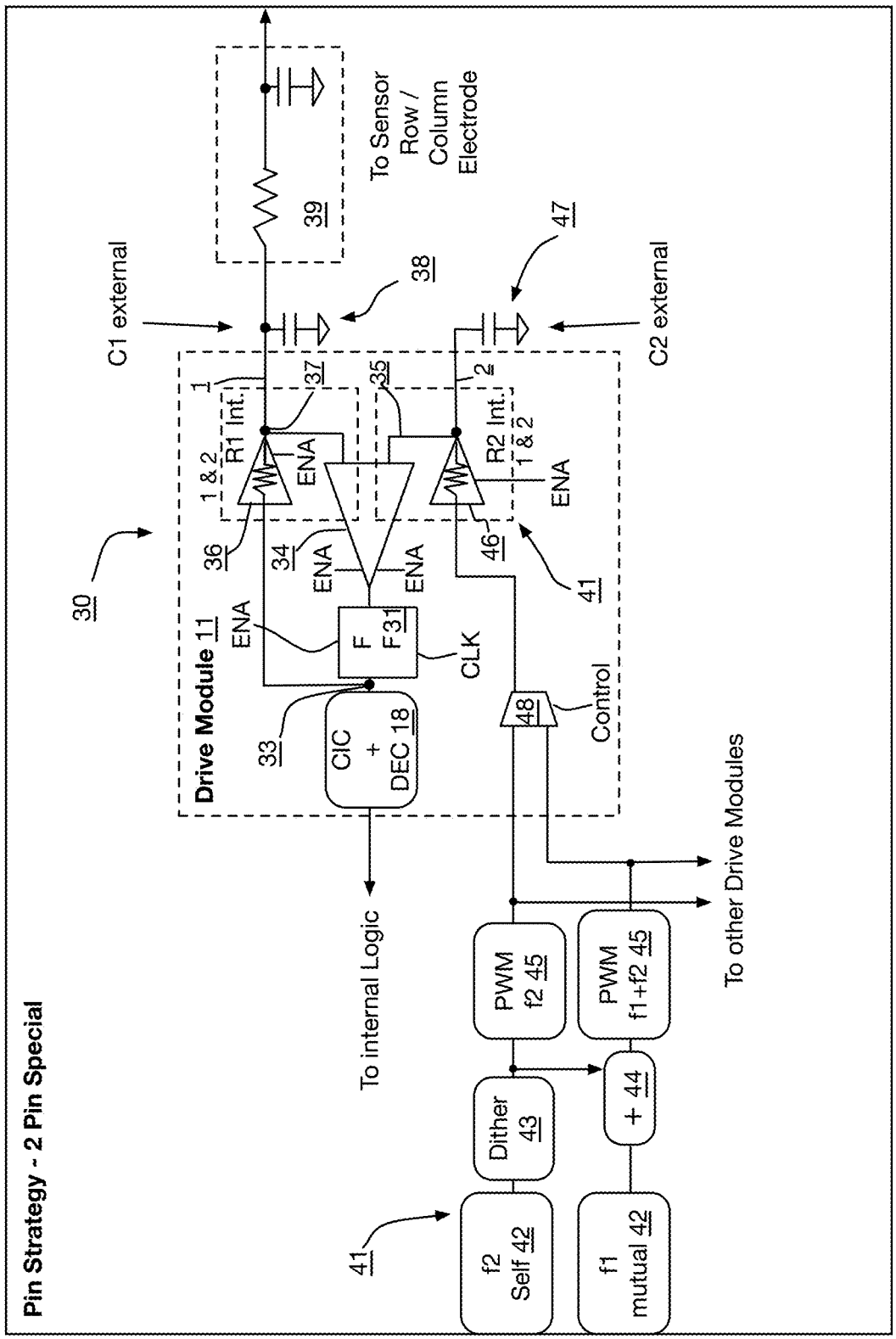
FIG. 10 is a schematic diagram showing an embodiment of a drive/receive circuit in a 2-pin configuration of programmable logic with special requirements that may not be available in present generation programmable logic.

Another embodiment of the channel driver FIG. 10 uses two pins per channel and functions without the mutual transmit mode limitations discussed herein with respect to some other embodiments. It does not require internal analog channels and switches as the embodiment of FIG. 11 does, but may still require custom silicon at the present time due to the need for output and input buffer simultaneous function and also higher digital buffer output impedance. The depicted embodiment of FIG. 10 functions similarly to the version in FIG. 11, but employs two pins 1 and 2, and uses an external capacitor C2 external for the sigma-delta output capacitor 47 of the single sigma delta D/A converter for the sensor drive signal, made up of driver 46 and capacitor 47. The drive signal generation circuitry 41 also includes the driver 46 and external capacitor 47. This capacitor 47 is connected to the pin to filter the sigma-delta D/A conversion, and the resulting signal 35 is routed internally from the pin to the comparator 34 reference input, similarly to the design of FIG. 11. The depicted design may be used where on-chip capacitors are not available near the drivers. This design selects between the sensor signals of f2 or f1+f2 with a digital switch 48 rather than an analog switch. Alternately, the signal to be driven may be generated directly without the need for a selection switch, however this scheme provides ability to feed other drive/receive circuits with the digital versions of the two drive signals and avoid duplicating most of the drive signal generation circuitry 41. The requirements to use this design with an FPGA implementation are first a comparative input and digital output for each I/O pin employed, second a digital output impedance at driver 36 high enough for the required sigma-delta output filter at C1.

The different transmit receive modes herein, including those of FIG. 3, FIG. 4, FIG. 5, FIG. 6 and FIG. 15 may be applied with this embodiment.

Figure 9:
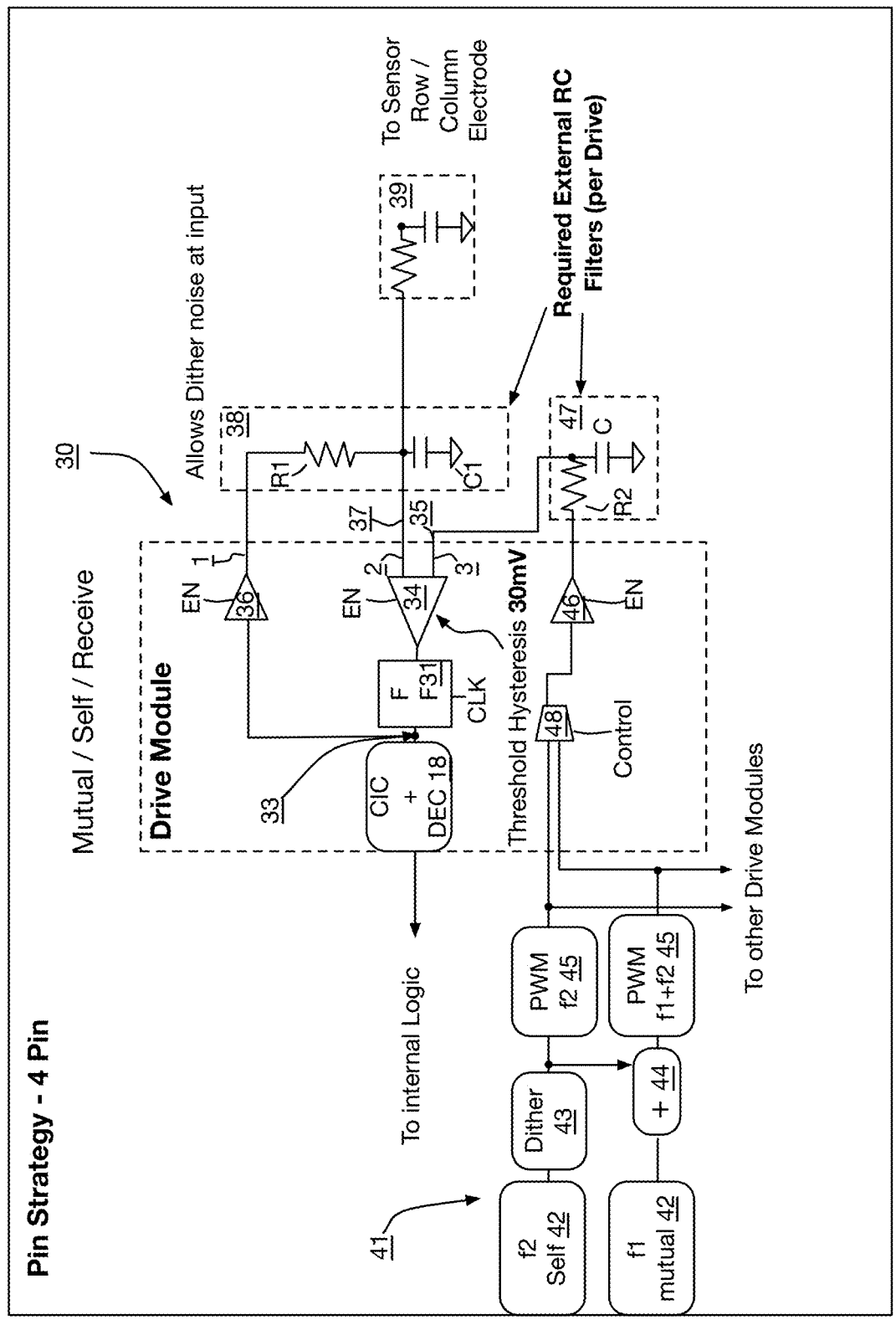
FIG. 9 is a schematic diagram showing an embodiment of a 4-pin configuration drive/receive circuit.

FIG. 9 shows another embodiment of the channel drive/receive circuitry, which is capable of the same function as the previous two examples but uses four pins labeled 1-4. This embodiment will work on most present day programmable logic devices but requires two differential digital input and two digital output pins plus two resistors and two capacitors to operate per channel. The digital output drivers at pins 1 and 4 do not require especially high output impedances for this version. Generally the drive signal generation circuitry 41 is constructed the same as the previous version, with the control switch 48 being a digital switch because the PWM signals from PWM modulators 45 are still digital entering control switch 48. The sigma-delta D/A converter converting the sensor signal to analog is implemented with a digital output driver 46 and a sigma delta output filter made up of output capacitor 47 and resistor R2. This sigma-delta output filter is preferably a single pole RC filter as depicted, with a cutoff frequency of approximately 1 Mhz. This filter output is the analog sensor drive signal 35, which is connected from the filter output capacitor 47 back into pin 3, to the reference input of comparator 34.

The drive/receive circuit 30 again uses a voltage following sigma-delta A/D converter driven at its reference input with analog sensor signal 35 to achieve a sigma-delta analog to digital transceiver. The sigma-delta D/A portion of the voltage following circuit in this version includes digital output driver 36 at pin 1, and a sigma delta output filter 38 built of external resistor R1 and capacitor C1. The example filter in this version is a single pole RC filter with a cutoff frequency of about 1 Mhz. The various single- and multi-frequency driving and receiving schemes described herein may all be used with this embodiment, including the driving process of FIG. 3, FIG. 4, FIG. 5, FIG. 6 and FIG. 15.

Figure 8A:
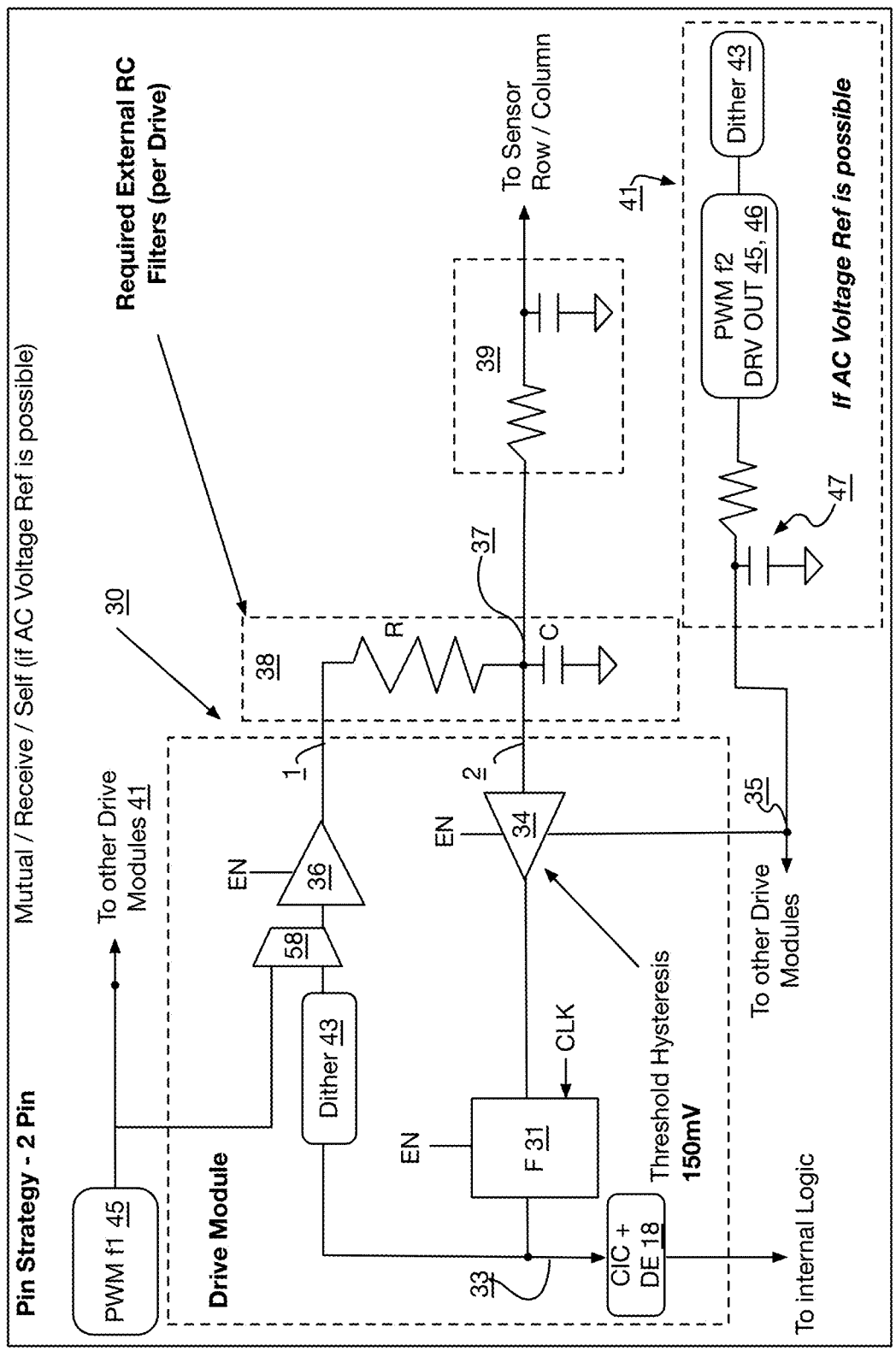
FIG. 8A is a schematic diagram showing an embodiment of a 2-pin configuration drive/receive circuit.
Figure 8B:
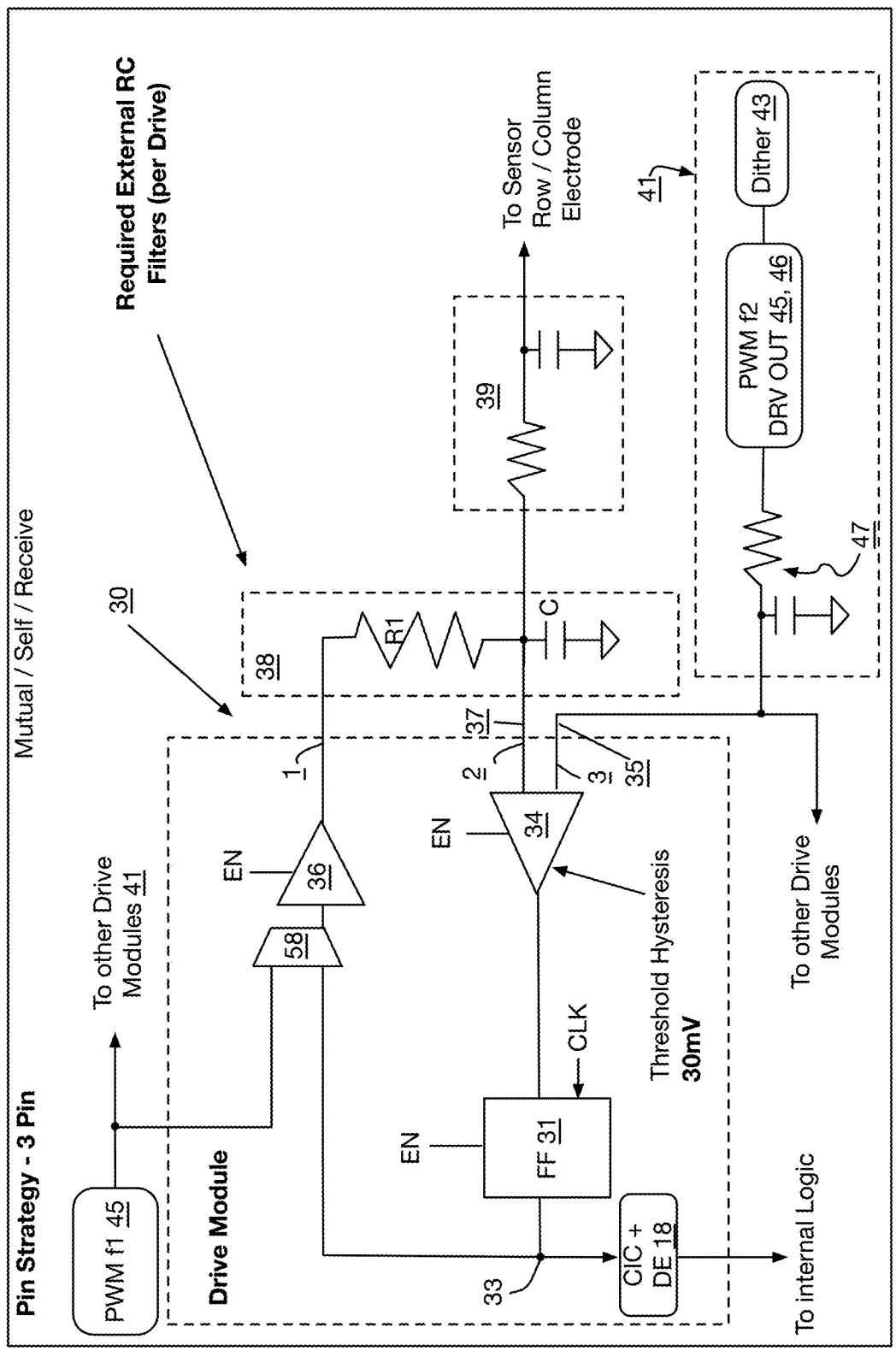
FIG. 8B is a schematic diagram showing an embodiment of a 3-pin configuration drive/receive circuit.

FIG. 8B shows another embodiment of a channel driver, which can also work on present day programmable logic device designs, requiring only two differential digital input comparator pins and one digital output pin for a total of three I/O pins per channel used. Its only limitation in this regard is that the mutual capacitive mode transmit channel (the mutual signaling is typically used to measure mutually coupled capacitance but may be used to measure mutual inductance or resistively coupled signals), of which there may be only one active at a time, cannot act as a receive for self or pen receive. In the depicted embodiment, the drive signal generation circuitry 41 is common to all the transmitting drive modules, and is connected to the circuit 30 at separate locations, the f1 mutual sensor signal being digitally generated and fed to be pulse-width modulated in the PWM f1 block 45 in the upper left of the drawing. This circuitry is internal to the IC. This modulated f1 mutual sensor signal is fed to a digital control switch 58, which passes through either the output of the sigma-delta A/D converter at node 33, or the PWM f1 signal, to the sigma delta driver 36, which is configured as a sigma-delta D/A converter by the connection to the sigma-delta output filter 38 connected to pin 1. The output of filter 38 is, similarly to the previous figure, connected to virtual signal node 37, which is connected to the voltage-following sigma-delta A/D converter input on pin 2. Node 37 is also connected to the EMI filter 39 and, through this filter, coupled to the row electrode to send and receive the sensor signals similarly to the other versions herein. In this version, as can be seen, the reference input of the voltage-following sigma-delta A/D converter, at pin 3, is connected to the analog self sensor signal. This signal is produced by the other portion of the drive signal generation circuitry 41, which as shown takes a dithered version of the f2 sensor signal and digitally pulse width modulates and drives this signal out an output, where it is filtered by sigma-delta DI A output filter 47, and then is fed to the comparator reference node at pin 3. The filter 47 is typically external to the IC, and the dithered f2 self sensor signal is driven out a pin to this filter. This pin is not counted in the pin count of the circuit because this single self sensor signal is used to drive all the other self signal transmitting at other drive channels, as shown by the arrow going to other drive modules. The mutual sensor signal, in this version, is fed to the other channel drive modules as a digital PWM signal, as seen at circuitry 41 in the upper left of the drawing. The received signal at node 33 is continuously filtered and decimated through to the internal receiver logic at block 18, similar to the other embodiments herein. It should be noted that one distinction between the circuit of FIG. 8B and that of FIG. SA is the difference in the threshold hysteresis from approximately 30 m V and approximately 150 m V due to the use of a comparator input in FIG. 8B versus a digital input in FIG. SA. The digital input with a higher hysteresis has more requirements for dither which is shown in FIG. 5A injected in the AID feedback loop at dither block 43.

In operation, it can be understood that the depicted circuit will typically operate to drive to the sensor electrode and sense from the sensor electrode the f2 self sensor signal, and simultaneously receive the f1 signal if it is coupled through from other crossing sensor electrodes. When in the course of scanning the mutual signal on individual electrode channels, the drive process reaches this channel, the logic changes switch 58 to feed the f1 mutual signal out, and the digital signal passed out of the drive module to internal logic is not used during this time.

Figure 3:
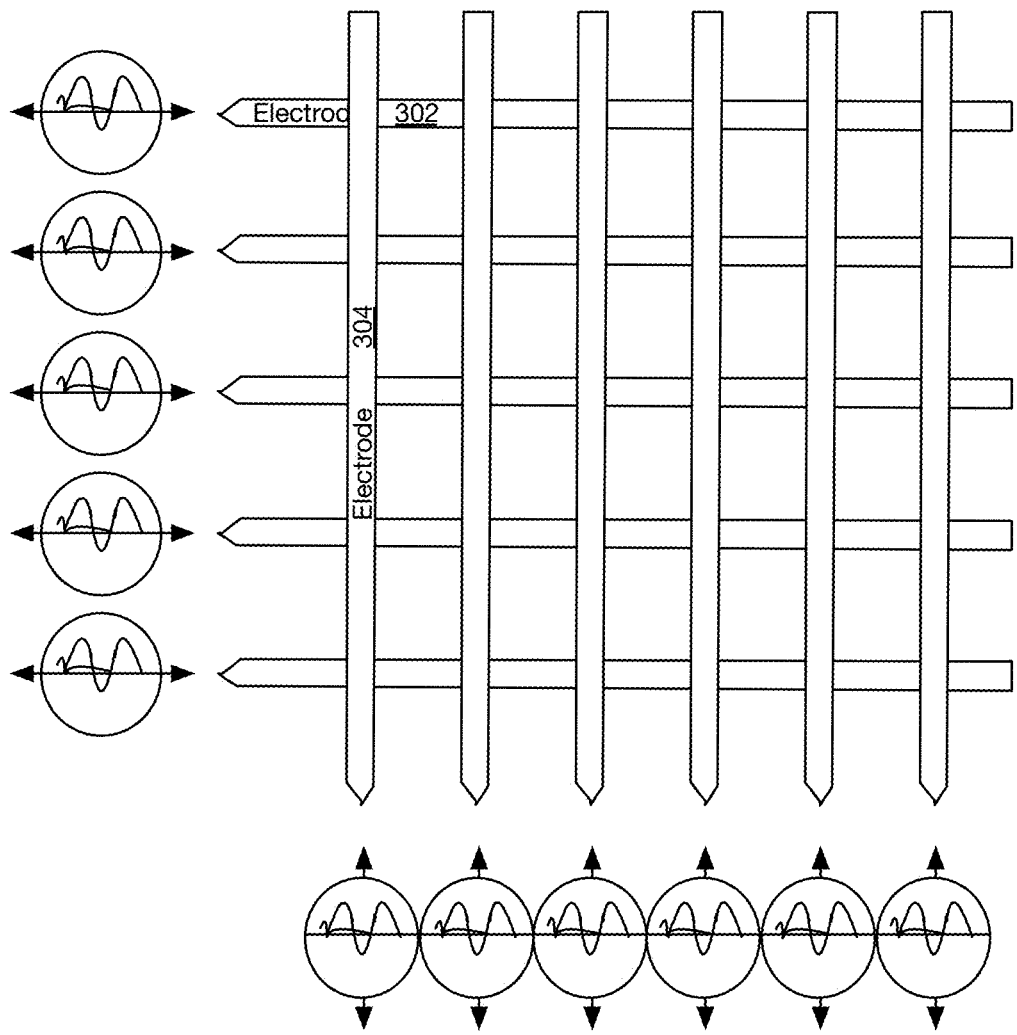
FIG. 3 is a diagram of an embodiment of a simultaneous drive method showing a multi-mode state (Self+Receive) and indicating in notes the different pin configurations capable of achieving such.
Figure 4:
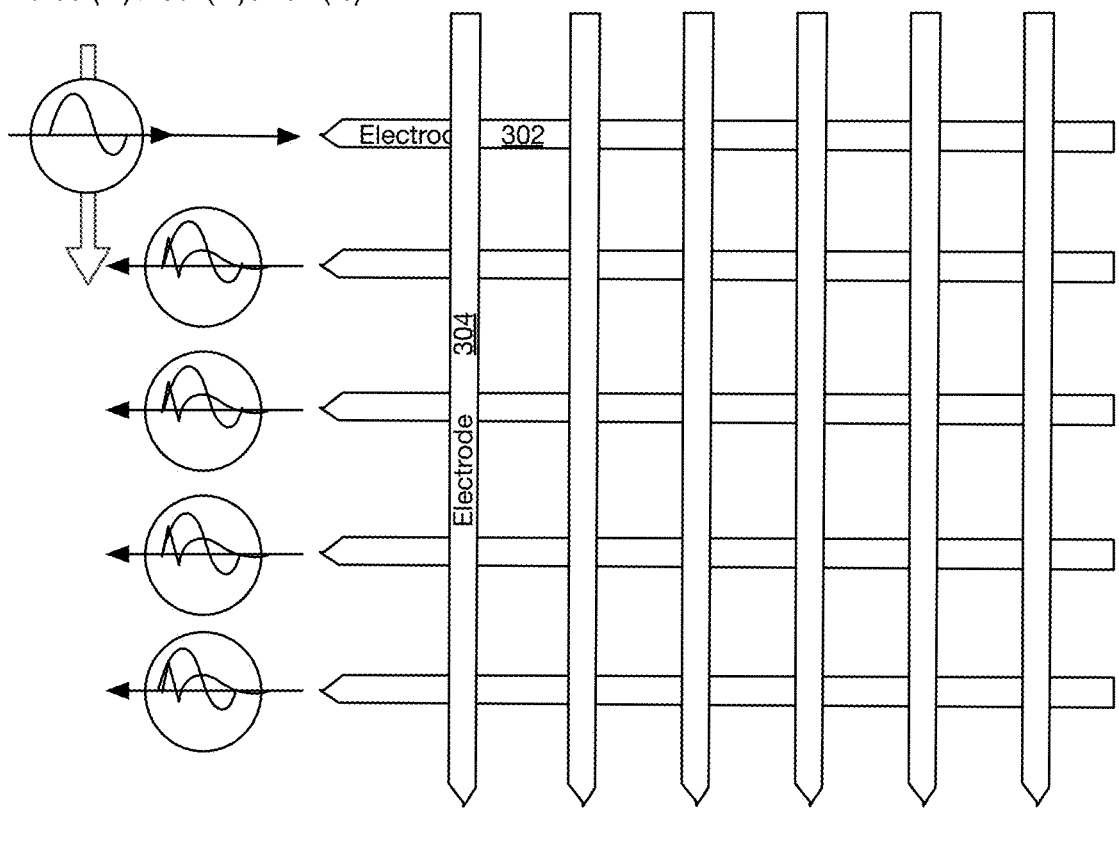
FIG. 4 is a diagram of an embodiment of a simultaneous drive method showing a multi-mode state (Self+Receive+Mutual Scan) and indicating in notes the different pin configurations capable of achieving such.
Figure 5:
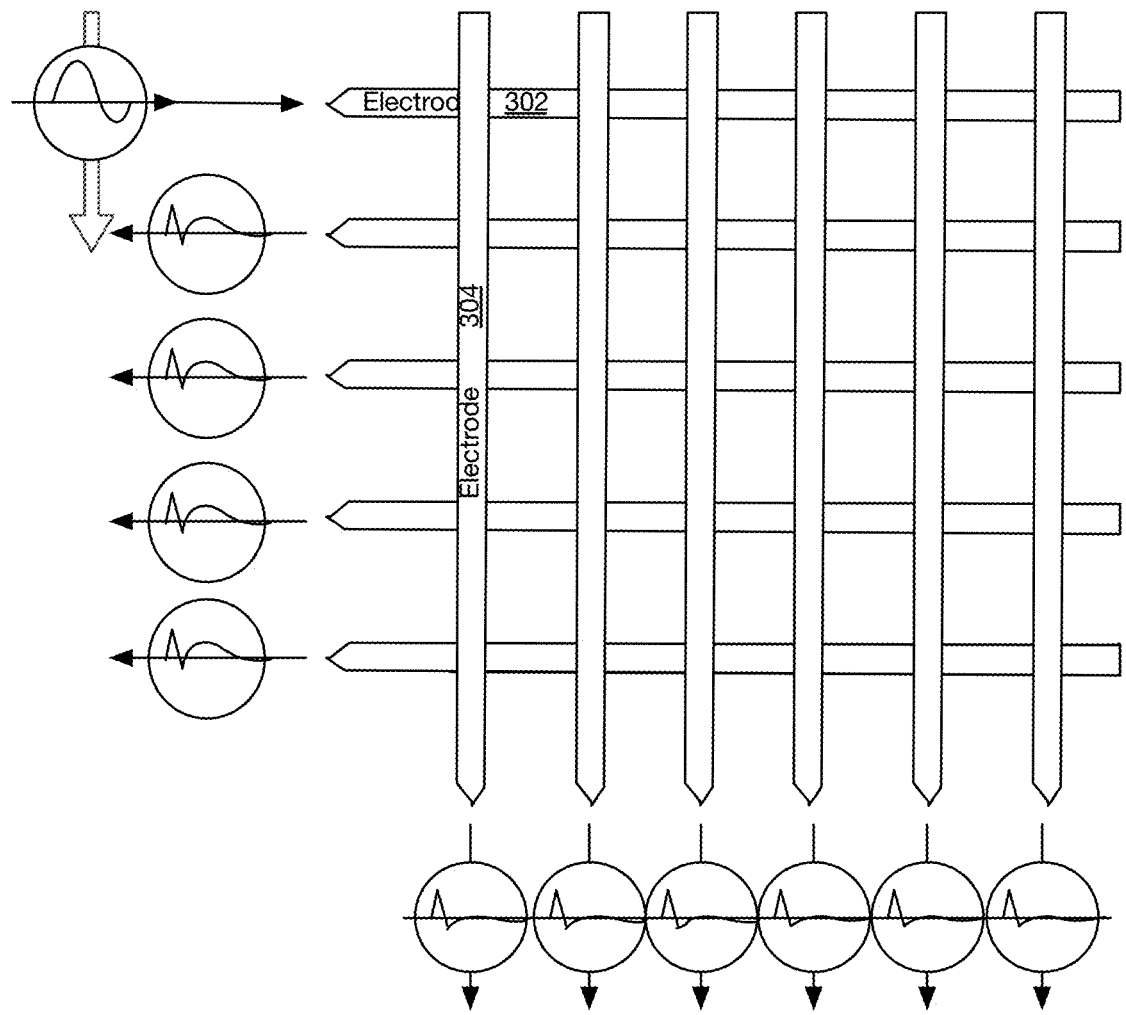
FIG. 5 is a diagram of an embodiment of a simultaneous drive method showing a multi-mode state (Receive+Mutual Scan) and indicating in notes the different pin configurations capable of achieving such.

The signal driving and receiving schemes shown in the diagram of FIG. 3 showing self-capacitive and receive signals, the diagram FIG. 4, showing mutual capacitance and self-capacitance without the mutual TX channel, and pen receive mode without the mutual TX channel, and in the diagram of FIG. 5, showing mutual capacitance and pen receive mode without the mutual TX channel, may be applied with the embodiment of FIG. 8B.

FIG. SA shows another embodiment of a channel driver, which is similar in function to the example of FIG. 8B, and is similarly limited in the mutual capacitive mode when transmitting. However, this circuit uses only two digital pins, and so may be better for use in a high channel count system. The depicted channel driver circuitry 30 may be employed with in situations where a controllable AC voltage reference is available for digital input pins, as seen by the f2 self sensor signal being fed to the voltage reference of the pin 2 receiver, which functions as the sigma-delta comparator in this embodiment. Typically, a digital input pin functions as a comparator but FPGA or PLD designs do not always provide ability to control the reference voltage of such pins. Where that capability is available, the present circuit may be used, with a common self signal driven out a pin at PWM and driver 45,46, and filtered to create an ADC version of the self sensor signal 35, then fed into a single pin to the driver reference voltage for all digital input receivers. As shown on the drawing, this scheme is only possible if on an FPGA or PLD an AIC voltage may be fed to the digital input pin references. If not, the scheme must be implemented with a custom ASIC, in which case a 1 pin solution is preferred. Many present day programmable logic devices exhibit about a 150 m V hysteresis on the digital input pin, which is considerably greater than the approximately 30 m V hysteresis show on the specs for analog comparators in the same hardware. Use of analog comparators is therefore preferred to obtain better signal-to-noise ratios, however the depicted circuit may still enable multi-touch capability with much improved economics over other previous sensor driver circuits. The remainder of the circuit functions similarly to that of FIG. 8B, and may be used with the same self, mutual, and pen transmit and receive schemes as the circuit of FIG. 8B.

Some alternate embodiments include a solution employing more analog circuitry, which may be embodied in an ASIC or in circuitry external to the IC, such as a higher order AID converter and higher order DIA converter in the voltage-following sigma-delta converter. Also the use of op-amps configured as voltage follower buffers feeding high resolution analog to digital converters could be used as channel drivers. These solutions are not ideal due to greatly increased silicon real estate requirements and associated analog signal handling requirements.

Some versions may include a numerically controlled oscillator(s) generating one or more frequencies for drive signals. Such oscillators are well understood and common knowledge in the field.

Referring now to the processes of driving and receiving touch sensor signals, which may be done with circuits described herein or other circuits, generally various driving and receiving schemes are described with respect to FIGS. 2-6 and FIGS. 13-17.

FIG. 2 is a legend for interpreting the signaling diagrams of FIGS. 3-6, 13, and 15. At the top, symbols are given for the various analog sensor signal frequencies f1 (used for mutual coupled signals), f2 (used for self sensed signals at the same electrode), and f3 (used for a pen injected signal). Next the symbols for transmitting and receiving the various signals are shown. The f2 self signal is shown with a two-way arrow because it is received or sensed on the same electrode as it is transmitted or driven. The Receive symbol is shown with only an incoming arrow for reception and some small mixed frequency symbol. The f3 pen frequency is shown only as a Receive because it is transmitted from an external pen electrode as the pen is moved over and on the touch sensor by a user. The scanning of the mutual transmit symbol, over a series of lines (rows or columns) is shown by the symbol with a wide arrow through it. Below that, the preferred clock frequency ranges for the embodiment shown in FIG. 1 are listed.

FIG. 3 is a diagram showing an embodiment of a simultaneous drive method showing a multi-mode state (Self+ Receive), and indicating in the notes the different pin configurations herein capable of achieving the signaling scheme. The depicted sensor electrodes in the array are, in this version, the rows 302 and columns 304 of a touch screen or touch sensor array. As discussed herein, other types of touch sensor array may be used, and a capacitive multi-touch sensor is preferred. The symbols indicate that second frequency f2 self sensor signal is transmitted on each row 302 and column 304 electrode, and sensed on the same electrodes, the sensing is done simultaneously with transmitting, as described above with respect to the drive/receive circuitry. Simultaneously with sending and receiving the second frequency f2 self sensor signal, the third frequency f3 pen sensor signal is received or sensed on all rows and columns, transmitted of course from a pen used with the touchscreen or touch sensor. While all rows and columns are shown employed in the depicted method, at a minimum not all rows or columns have to be used to perform the method.

A sub-group may be selected, or a group of all rows and columns.

Figure 13:
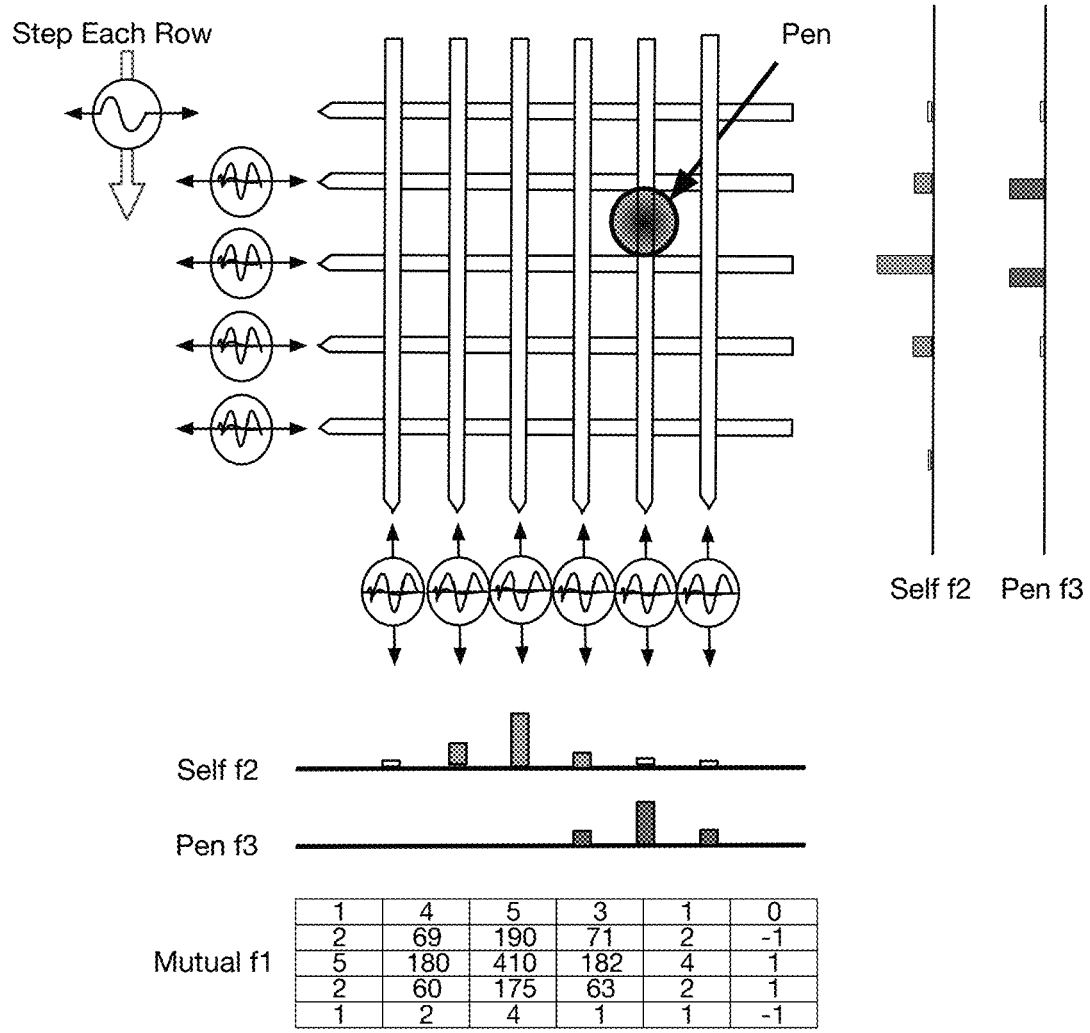
FIG. 13 is a diagram showing the resultant signal energies from both human contact and the pen digitizer which are all sampled in the same 5 mS frame.
Figure 14:
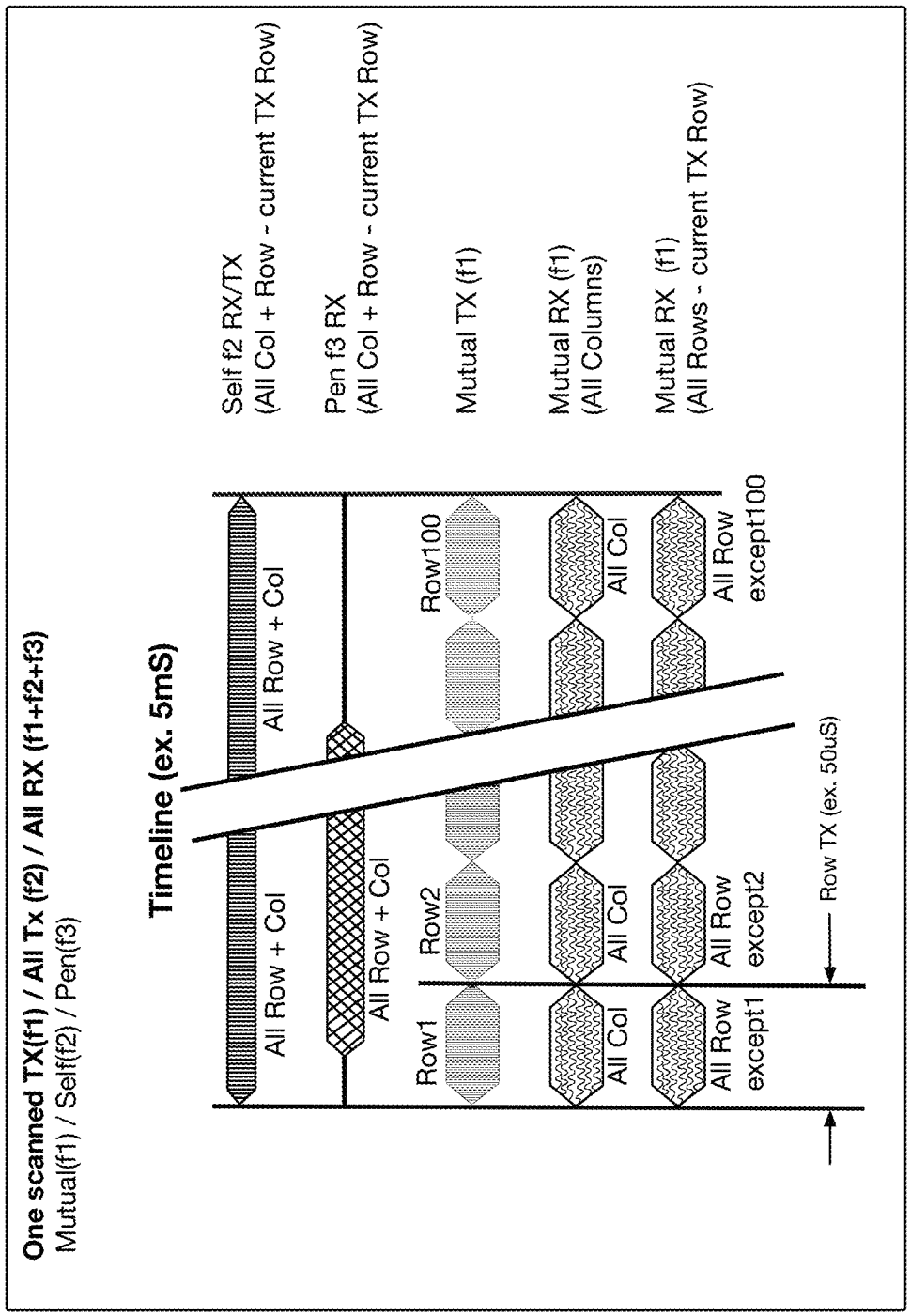
FIG. 14 is a timing diagram showing a single capture frame with simultaneous Self, Pen, and Mutual scan for FIG. 13.

FIG. 4 is diagram showing an embodiment of a simultaneous drive method with a multi-mode state (Self+Receive+Mutual Scan), and indicating in notes the different pin configurations capable of achieving such. As shown by reference to the symbol legend, the first frequency f1 mutual analog sensor signal is scanned over successively over each row 302, preferably at a 5 ms total cycle, and received at all the rows 302 and columns 304 except the one currently transmitting. When the depicted scan cycle reaches a row, the drive receive circuitry in that row changes modes to transmit the f1 mutual sensor signal. This f1 mutual scanning process may, of course, be done with the columns rather than rows, as their orientation is not important. The scanning process starts again at the first row when the last row is completed. The second frequency f2 self sensor signal is transmitted and received/sensed on all rows and columns simultaneously except the one currently transmitting. Finally, the third frequency f3 pen sensor signal is received on all channels simultaneously except the one currently transmitting. FIGS. 13 and 14 also describe this signaling scheme. FIG. 13 is a diagram showing the resultant signal energies from both human contact and the pen digitizer which are all sampled in the same 5 mS frame as used in the example timing scheme for FIG. 4. As with the other drawings, the particular time period is not limiting and other time periods may be used. FIG. 14 is a timing diagram showing a single capture frame with simultaneous Self, Pen, and Mutual scan for FIG. 13. As can be seen in FIG. 13, the sensing of the f2 frequency self signal provides data stored in a two-dimensional format, with one dimension being the location from which the data is sensed, along the columns as shown on the bottom, and the other being the signal magnitude of the data point. More such 2-dimensional data is received from the rows as shown on the Self f2 data set to the right of the array. The size of the bar for each data point represents the signal intensity. The sensed Self f2 data points show touches on the touchscreen as indicated by the finger touch shown at the large oval on the array. Similarly, 2-dimensional data is received for the Pen f3 frequency, with the received pen data shown for the columns marked Pen f3 and showing a spike where the pen is depicted placed on the touchscreen. The rows also receive a data spike as seen in the Pen f3 data along the right side of the figure, the data spike centered around the depicted pen location. As discussed above, the Pen f3 data represents a signal generated on the pen and coupled into the sensor array, typically capacitively coupled, such that the closest rows and columns to the pen receive a stronger signal while most rows and columns will not detect a signal. Finally, in FIG. 13, the data detected through sensing the f1 mutual analog sensor signal is provided as a 3-dimensional array, because each detected signal magnitude has a row and a column location associated with it, which are the row (or column) for the active mutual TX line when the data point is detected, and the column (or row) at which the data point is detected. The third dimension is the magnitude of the signal, providing a three dimensional data array like the Mutual f1 array depicted at the bottom of FIG. 13. One benefit of the drive/receive circuit designs provided herein is that they allow the third frequency f3 pen data to be received simultaneously using the same circuitry employed to sense self data and mutually coupled data. Typically, previous systems either required a separate array to detect pen data or need to switch the circuitry to a pen mode, not sensing self or mutual data, to detect the pen, and then switch back to sense touch from one of self or mutual signals, in a continuous cycle. As shown in the timing diagram of FIG. 14, the depicted signaling process is shown for a 100 row touchscreen or touch sensor over an example cycle period of 5 ms. As shown in the top row of the timing diagram, all rows and columns may receive the self sensor signal on f2 continuously, except the currently transmitting row "current TX row" on which the Mutual TX signal on the first frequency f1 is transmitted. The next row of the timing diagram shows that all rows and columns, minus the currently transmitting mutual row "Mutual TX" again, may receive the pen signal Pen f1. The pen timing diagram is shown as filling less than all of the time scale depicted because the pen signal is not always received, only when a pen is near or touching the touchscreen or touch sensor.

Still referring to the timing diagram of FIG. 14, the next row labeled Mutual TX (f1) shows the mutual signal being transmitted on each row by sequentially scanning it down the rows from row 1 to row 100. The example time period on each row is given as 50 uS. The row below shows that the mutual signal reception (sensing) is done on all columns, to receive any mutual signal coupled through to any column by touch on the touch sensor, and the row below that shows the mutual reception is done on all rows except the row on which the mutual signal is transmitted. While the depicted scheme scans the mutual analog sensor signal over all the rows, of course the columns could be scanned instead, or both rows and columns could be scanned in sequence. Further, less than all of the rows or columns might be scanned with the mutual signal in any particular control scheme. A group may also be selected of less than all of the rows and columns to transmit and sense the self signal. A method of driving and receiving signals to and from a multi-touch sensor generally includes (a) for each of a first group of electrodes comprising row or column electrodes of the multi-touch sensor, sequentially scanning a mutual analog sensor signal through the group of electrodes by feeding it to respective sigma-delta D/A converters connected to the respective electrodes, the mutual analog sensor signal comprising a first frequency; (b) while performing (a), for each of a second group of electrodes comprising row electrodes or column electrodes of the multi-touch sensor, simultaneously driving a self analog sensor signal through a sigma delta D/A converter onto pins coupled to the respective row electrodes or column electrodes, the respective self-capacitive analog sensor signals comprising a second frequency or a data pattern modulated at a second frequency; (c) for each of the second group of electrodes used in (b), simultaneously sampling touch sensor data for at least two different modes of self and mutual, the touch sensor data comprising sensed altered sensor signals at the first and second frequencies, altered by the impedance of the row or column electrodes.

FIG. 5 is an embodiment of a simultaneous drive method showing a multi-mode state (Receive+Mutual Scan) and indicating in notes the different pin configurations capable of achieving such. As with the above versions, the first frequency f1 mutual analog sensor signal is scanned over successively over each row 302, preferably at a 5 ms total cycle, and received at all the rows 302 and columns 304 except the one currently transmitting. When the scan cycle reaches a row, the drive receive circuitry in that row changes modes to transmit the f1 mutual sensor signal. The rows and columns may, of course, be interchanged. The scanning process starts again at the first row when the last row is completed. The third frequency f3 pen sensor signal is received on all channels simultaneously with receiving the first frequency f1 sensor signal, except on the channel currently transmitting. As discussed above, at a minimum the method is performed by selecting groups of more than one electrode, which may include all electrodes. The method is generally described with the steps of or each of a first group of electrodes comprising row or column electrodes of the multi-touch sensor, sequentially scanning a mutual analog sensor signal through the group of electrodes by feeding it to respective sigma-delta DIA converters connected to the respective electrodes, the mutual analog sensor signal comprising a first frequency. While scanning the f1 mutual sensor signal, for each of a second group of electrodes comprising row electrodes or column electrodes of the multi-touch sensor, the method senses touch sensor mutual data, the touch sensor mutual data comprising sensed altered sensor signals at the first frequency, altered by coupling between the row and column electrodes. The method may further include, simultaneously to the sensing of the mutual data, for each of the second group of electrodes, the method simultaneously samples a pen analog sensor signal transmitted from a pen at a frequency different from the first frequency using the same A/D converter performing the mutual sensing. The simultaneous sampling may be performed by a voltage following sigma delta A/D converter integrated with each sigma-delta DIA converter driving the respective row or column electrodes, the voltage following A/D converter having a comparator with a first reference comparator input and a second comparator input, the second comparator input connected to the sigma-delta D/A converter output. Generally, the circuit of FIG. 7 may be used or any of the circuit embodiments identified in FIG. 5, or other suitable circuits may be used. The self transmit signal not necessarily active in this particular method.

Figure 6:
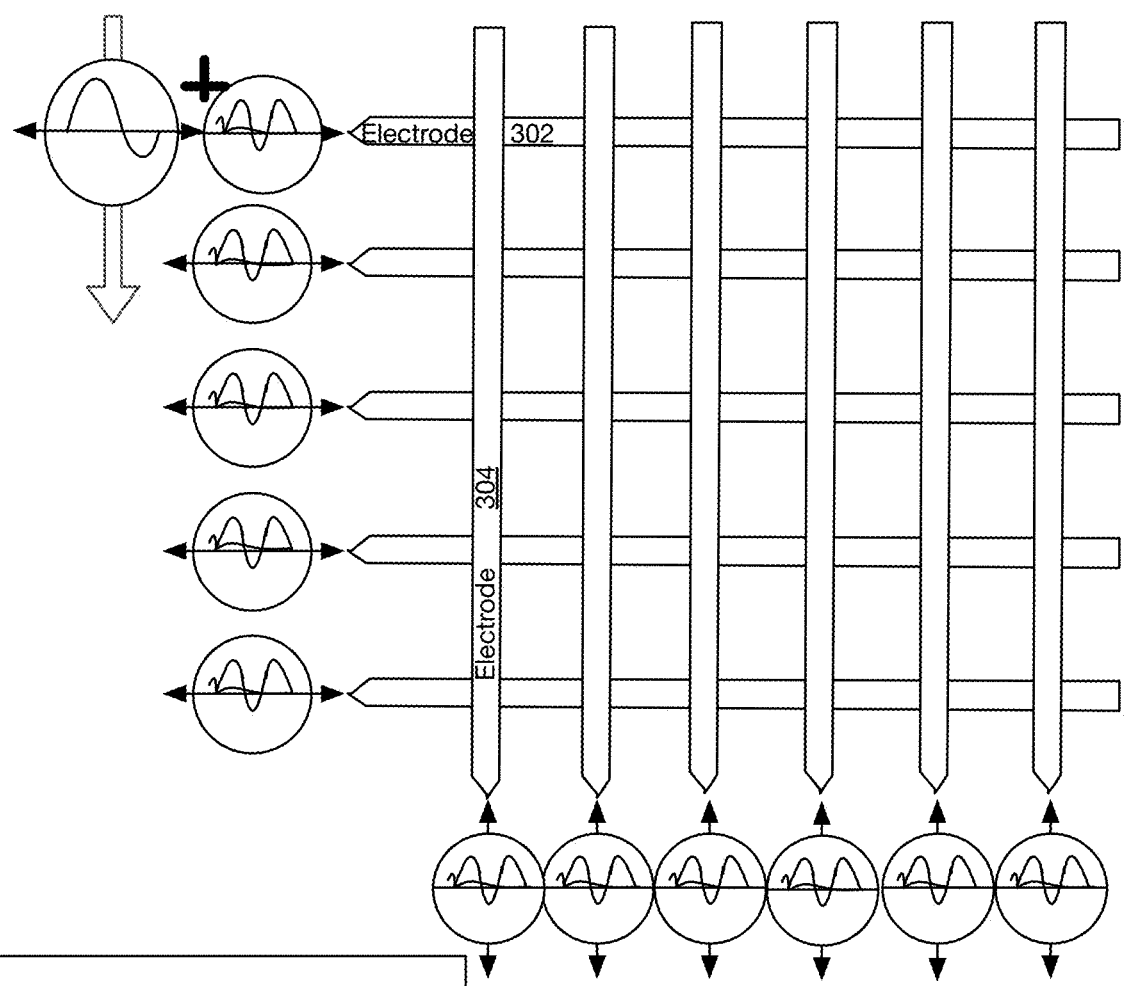
FIG. 6 is a diagram an embodiment of a simultaneous drive method showing a multi-mode state (Self+Receive+Mutual Scan) and indicating the different pin configurations capable of achieving such.

FIG. 6 is a diagram of an embodiment of a simultaneous drive method showing a multi-mode state (Self+Receive+Mutual Scan) and indicating the different pin configurations capable of achieving such. FIG. 6 shows full signal function with all modes of mutual and self, and receive active. As shown by the symbols and their legend, the first frequency f1 mutual analog sensor signal is scanned over successively over each row 302, preferably at a 5 ms total cycle, and received at all the rows 302 and columns 304 including the one currently transmitting the mutual signal. This f1 mutual scanning process may, of course, be done with the columns rather than rows, as their orientation is not important. The scanning process starts again at the first row when the last row is completed. The second frequency f2 self sensor signal is transmitted and received/sensed on all rows and columns simultaneously. Finally, the third frequency f3 pen sensor signal is received on all channels simultaneously. As discussed with respect to the other methods, groups of less than all rows or less than all columns may be employed without departing from the general methods described herein. For example, if a particular device were to not sense on particular rows or columns, but generally perform the methods herein, it would use the groups of electrodes as described herein. FIGS. 13 and 14 also describe this signaling scheme, except that for this process, the labels on the top right of FIG. 14 of Self f2 RX/TX (All Col+Row . . . ) should not exclude the currently transmitting row as done with regard to FIG. 4, because the circuit arrangements listed (4. Pin minimum function, 2 Pin Special, and 1 Pin Special of FIGS. 9-11) allow control of the circuit modes to receive the self f2 and pen f3 signals on all rows, even that currently transmitting the mutual signal. It is understood for all of these schemes that the rows and columns may be switched, and non-traditionally shaped arrays may also be employed with the circuitry and schemes described herein.

Figure 15:
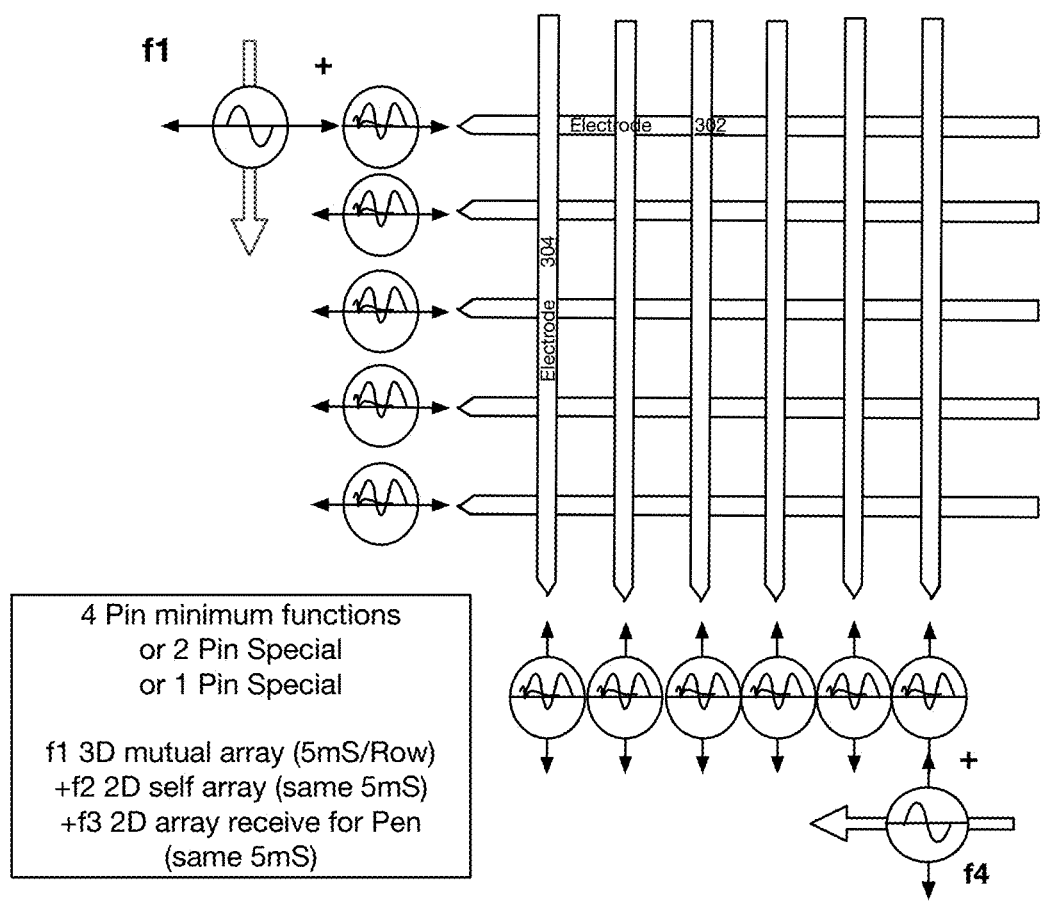
FIG. 15 is diagram showing an embodiment of a simultaneous drive method showing a multi-mode state (Self+Receive+Dual Mutual Scan) and indicating the different pin configurations capable of achieving such.

FIG. 15 is diagram showing an embodiment of a simultaneous drive method showing a multi-mode state (Self+Receive+Dual Mutual Scan) and indicating the different pin configurations capable of achieving such. The depicted method employs a dual axis scan scheme where operation during independent mutual capacitive mode or simultaneously with other sampling and driving modes can be achieved. The scan uses an additional fourth frequency for an independent mutual scan that is conducted simultaneously to the f1 mutual scan. For example, TX (transmit f1) on rows 302 and RX (receive f1) on Columns 304. TX mutual frequency f4 on Columns 304 and RX mutual frequency f4 on Rows 302. While these independent mutual scans proceed, the self analog sensor signal at frequency f2 is transmitted and sensed on all the rows and columns, and the pen signal is sensed on all rows and columns. It is understood that the same drive/receive circuitry is configured in its different modes to perform the mutual scan as it cycles through each particular row. Generally, the method can proceed with less than all rows or columns in some situations, and includes for each of a first group of electrodes comprising row or column electrodes of the multi-touch sensor, sequentially scanning a mutual analog sensor signal through the group of electrodes by feeding it to respective sigma-delta DIA converters connected to the respective electrodes, the mutual analog sensor signal comprising a first frequency. While doing so, the method for each of a second group of electrodes comprising row electrodes or column electrodes of the multi-touch sensor, simultaneously drives a self analog sensor signal through a sigma-delta D/A converter onto pins coupled to the respective row electrodes or column electrodes, the respective self analog sensor signals comprising a second frequency or a data pattern modulated at a second frequency. For each of the second group of electrodes, the method simultaneously sampling touch sensor data for at least two different modes of self and mutual, the touch sensor data comprising sensed altered sensor signals at the first and second frequencies, altered by the impedance of the row or column electrodes. For each of the first group of electrodes and the second group of electrodes, the method simultaneously samples a third pen analog sensor signal a third transmitted from a pen at a third frequency different from the first and second frequencies. To accomplish the dual mutual scan, the method performs for each of the rows or columns that are not driven with the mutual analog sensor signal f1 (in this diagram, the columns), scanning a second mutual analog sensor signal sequentially through respective sigma-delta DIA converters onto pins coupled to the respective row or column electrodes, the second mutual analog sensor signal at a fourth frequency different from the first and second frequencies and different from a third pen frequency if a pen frequency is employed in the method. Then for each of the for each of the rows or columns that are driven with the f1 mutual signal, the method simultaneously samples touch sensor data for at least two different modes of self and mutual, the touch sensor data comprising received altered sensor signals at the second and fourth frequencies. The method may accomplish the simultaneous sampling using a voltage following sigma delta A/D converter integrated with each sigma-delta D/A converter driving the respective row or column electrodes, the voltage following A/D converter having a comparator with a first reference comparator input and a second comparator input, the first reference comparator input receiving the self analog sensor signal and the second comparator input connected to the sigma-delta DIA converter output. The two mutual signals may be added when the mutual mode is activated in the cycle by switching or coupling in the mutual signals in the manner shown in the various drive/receive circuit diagrams. The f4 mutual signal is generated digitally and may be fed to multiple channel drivers similarly to the f1 mutual signal as described in the various embodiments.

Figure 12:
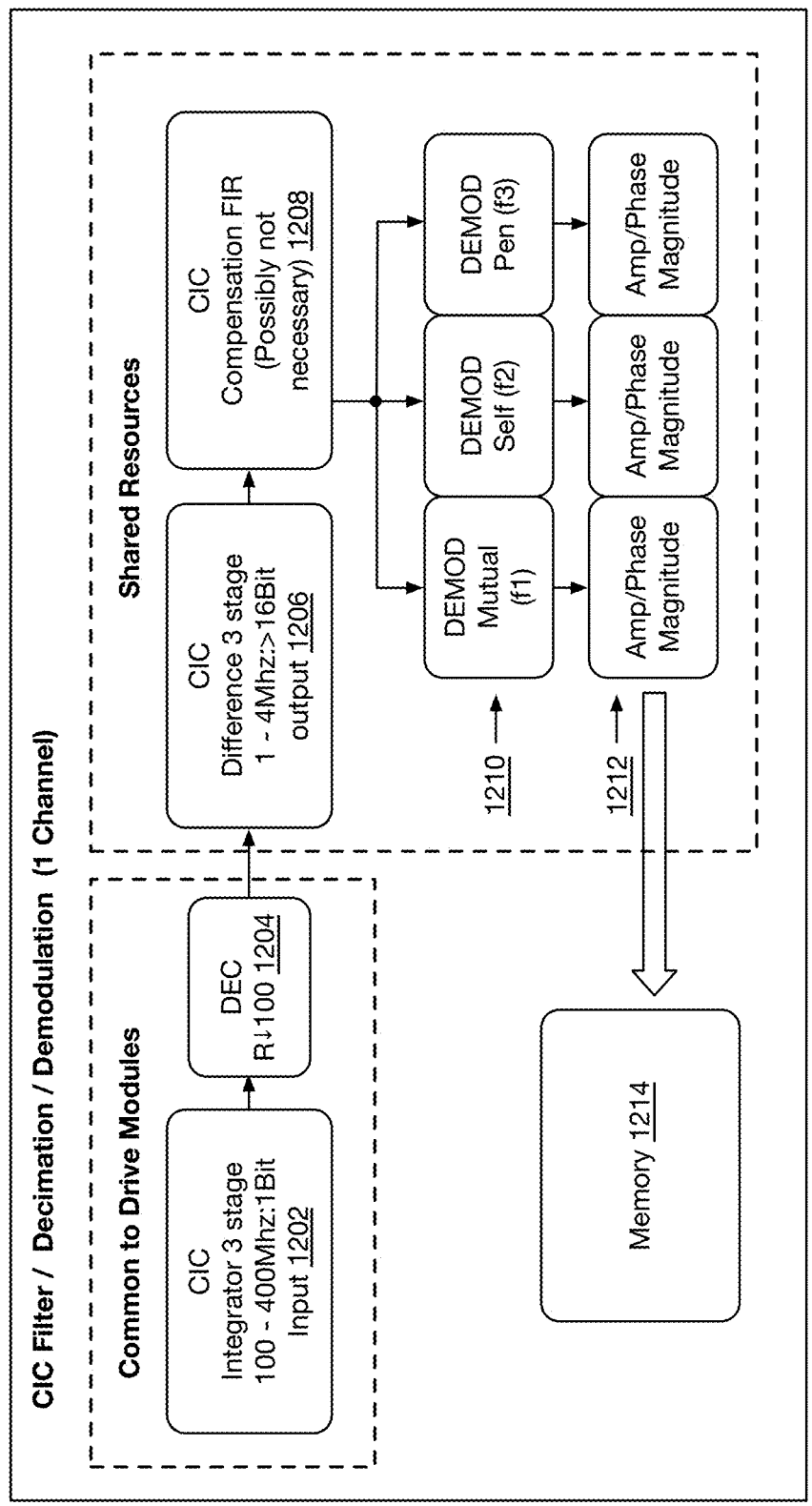
FIG. 12 is a block diagram showing an embodiment of a CIC (cascaded integrator-comb) Filter/Decimation/Demodulation/Amp/Phase sample chain showing resolution of three different simultaneous frequencies representing three separate modes of touchscreen function.

FIG. 12 is a block diagram showing an embodiment of a CIC Filter/Decimation/Demodulation/Amp/Phase sample chain showing resolution of three different simultaneous frequencies representing three separate modes of touch-screen function according to some embodiments. The received signal from the comparator output is passed to filter and decimation block, which in this version is implemented with CIC (cascaded integrator-comb) filtering, at least at the initial filtering stages. At block 1202, the filtering process starts with a CIC integrator, followed at block 1204 with a decimator reducing the sample rate to 1 to 4 Mhz. Next at block 1206, a CIC decimator is provided if necessary to remove DC components of the signal. At block 1208, a compensation FIR is provided if necessary to compensate for the effects of prior CIC filtering, such as passband droop and wide transition region.

The resulting data is sent to blocks 1210 where the signals are Quadrature Baseband Demodulated and the generated I/Q data is sent to blocks 1212 where Amplitude, Phase, and Magnitude are calculated and may be further filtered and decimated before being sent to Memory 1214 for storage and further DSP processing if necessary. The changes to the Amplitude, Phase, and Magnitude over time for each signal are then used to determine the presence of objects interacting with the sensors such as fingers or pens. Typically, the Self (f2) signals change by very small phase shifts, and Mutual (f1) and Pen (f1), received signals, change in amplitude. While quadrature baseband demodulation is described here, this is not limiting and many other suitable demodulation schemes may be used to extract the sensed signals in a form usable by the system to interpret touch.

Figure 16:
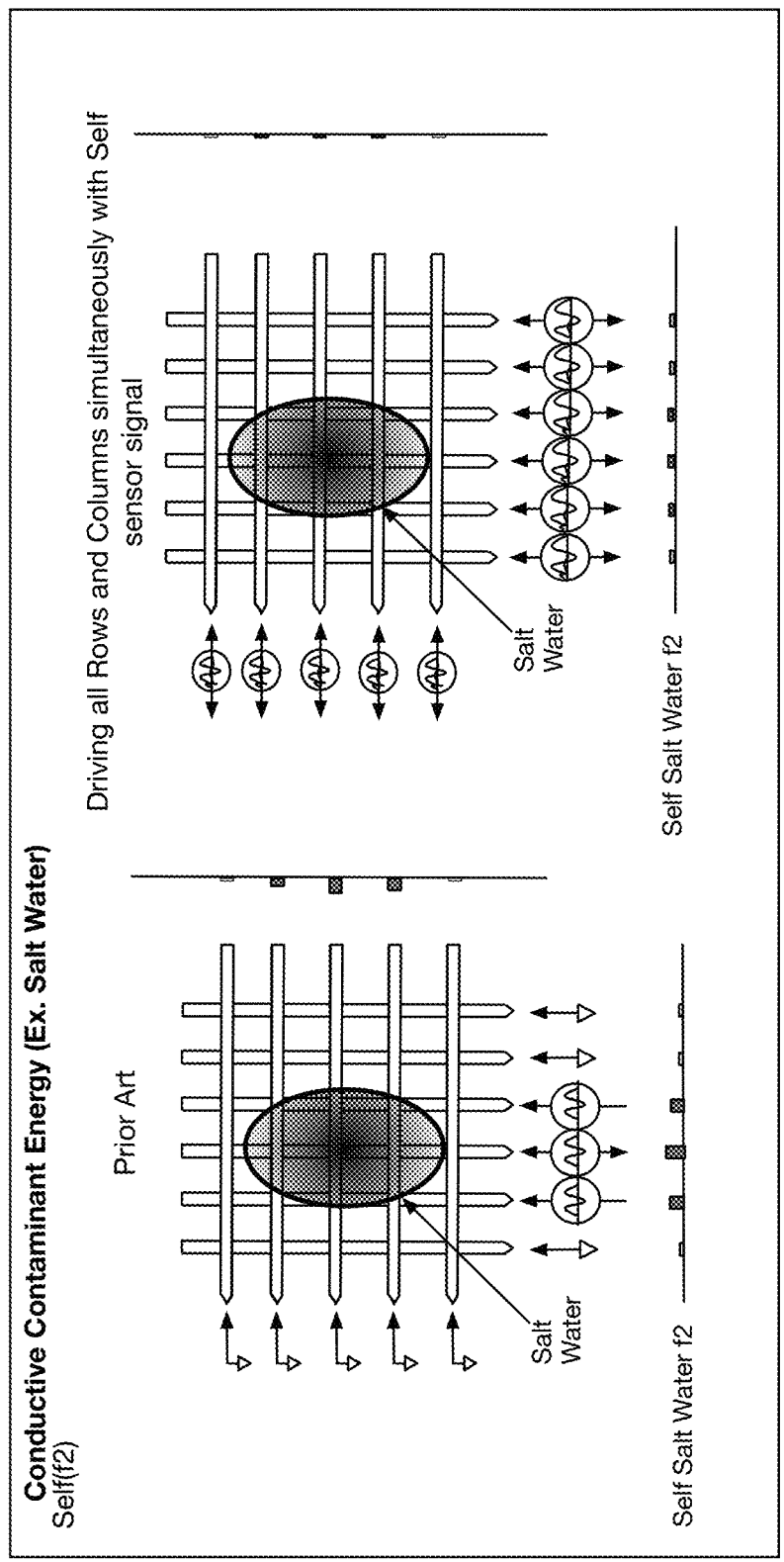
FIG. 16 is a diagram showing prior art self capacitance measurement with shielding elements and the same measure made on a system of the current invention with all elements simultaneously driven.

FIG. 16 is a diagram showing prior art self capacitance measurement with shielding elements and the current invention with all elements simultaneously driven. One significant advantage of the circuits herein may be observed on the figure, in that the noise caused by a conductive contaminant present on the touch sensor is greatly reduced when all rows and columns in the sensor array are driven as the circuits and methods herein enable.

Referring back to the system block diagram of FIG. 1, the system includes several functional blocks that one of ordinary skill in the art can implement after appreciating this specification and the construction directions below.

Dither Generator:

Some embodiments of the invention use the same dither on all channels as a method of achieving very similar sampling of system and external noise or alternately introducing a simple delay for each channel to allow for controlled same dither or semi-random dither generation.

A single dither signal generator may be used to supply a dither signal all the driver channels of the device. In some cases and modes, it may be beneficial to set all the dither signals to the same instant value so as to improve simultaneous sampling external noise recognition but in some cases having semi-random dither between channels could prove beneficial. Where the dither mixing occurs in the channel driver (a non-common dither source), a simple register delay scheme of only four positions allows enough differentiation from channel to channel.

Some embodiments of the invention provide improved resolution via use of shaped dither in combination with the continuous low frequency and low amplitude self-capacitive signal used as a reference to overcome hysteresis and quantization on the self-capacitance mode signals as well as other signals of interest such as the mutual capacitance receive and or pen receive signals.

In the Sigma Delta Analog to Digital Converter, dither noise is used to improve resolution and to overcome inherent hysteresis in the digital 1-bit ADC input or comparator. In current hardware this could be as low as 30 m V and or as high as 200 m V. Without dither the hysteresis will cause reduced resolution due to quantization caused by the DAC portion of the SD ADC having to charge the RC filter beyond the value required to match the reference voltage to the point where the hysteresis threshold is overcome—this process must then have to be reversed and the RC voltage must be discharged to pass the lower hysteresis bound. This creates a stair stepped "quantized" response.

Adding dither is a way of introducing a known noise to the system that is easily removed by subsequent filtering. Dithering effectively moves the signal randomly closer to the upper or lower hysteresis threshold so the true signal can trip the upper and lower threshold in a more average way. Using a continuously changing analog signal to allow frequency and low amplitude also achieves this effect to some extent. By using dither in combination with a continuous frequency of low amplitude (ex. 30 m V to 300 m V) even large hysteresis can be overcome for other low amplitude signals of interest while allowing for all-self measurement at the continuous frequency.

Figure 17:
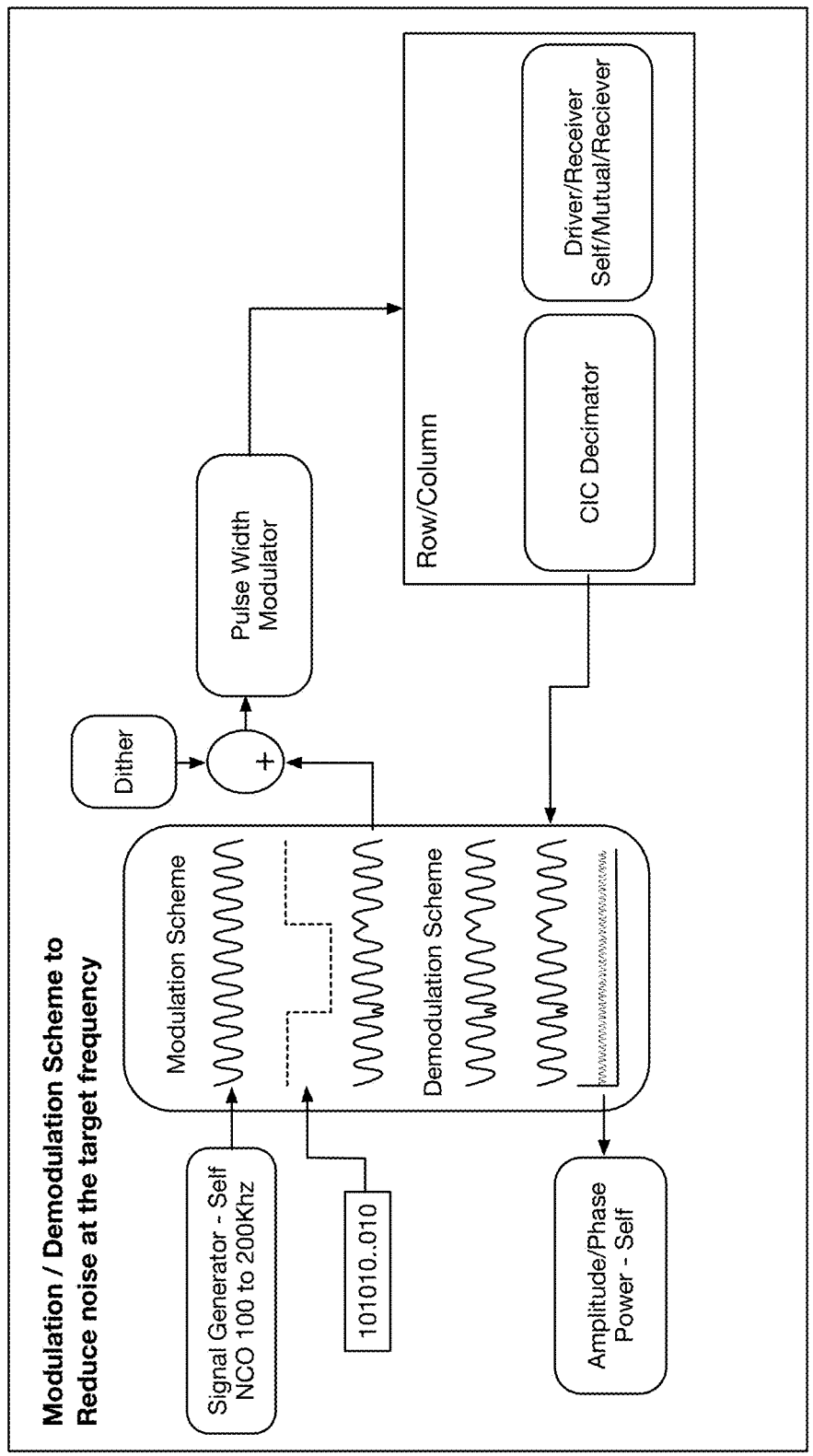
FIG. 17 is a diagram showing a phase modulation scheme to reject continuous interfering signals at the target frequency.

Advanced Modulation Schemes:

Some embodiments of the invention use well known modulation schemes, such as PSK, but directed in a novel way towards removing coherent interfering signals at the same frequency as the driving frequency. For example, FIG. 17 depicts a PSK coherent synchronous demodulation: A single frequency signal may be generated with a numerically controlled oscillator (NCO) and passed through a 50% duty cycle 180 deg phase shift modulation. This signal is dithered and then driven to touch sensor electrode as a self analog sensor signal according to the techniques herein. The recovered, or sensed, self signal is be filtered and decimated, and demodulated against the 50% duty cycle 180 deg phase modulation to produce a baseband continuous non-phase modulated signal. The single frequency is recovered with the benefit of now having any coherent interfering signal at the same frequency reduced or highly rejected.

As another example, an FSK coherent synchronous demodulation scheme may be used instead: A dual frequency signal may be generated with a 50% duty cycle. The recovered signal can be filtered and decimated and demodulated against the 50% duty cycle to produce a baseband continuous single frequency (DC) signal; the single frequency is recovered with the benefit of now having any coherent interfering signal at the same frequency reduced or highly rejected.

Figure 18:
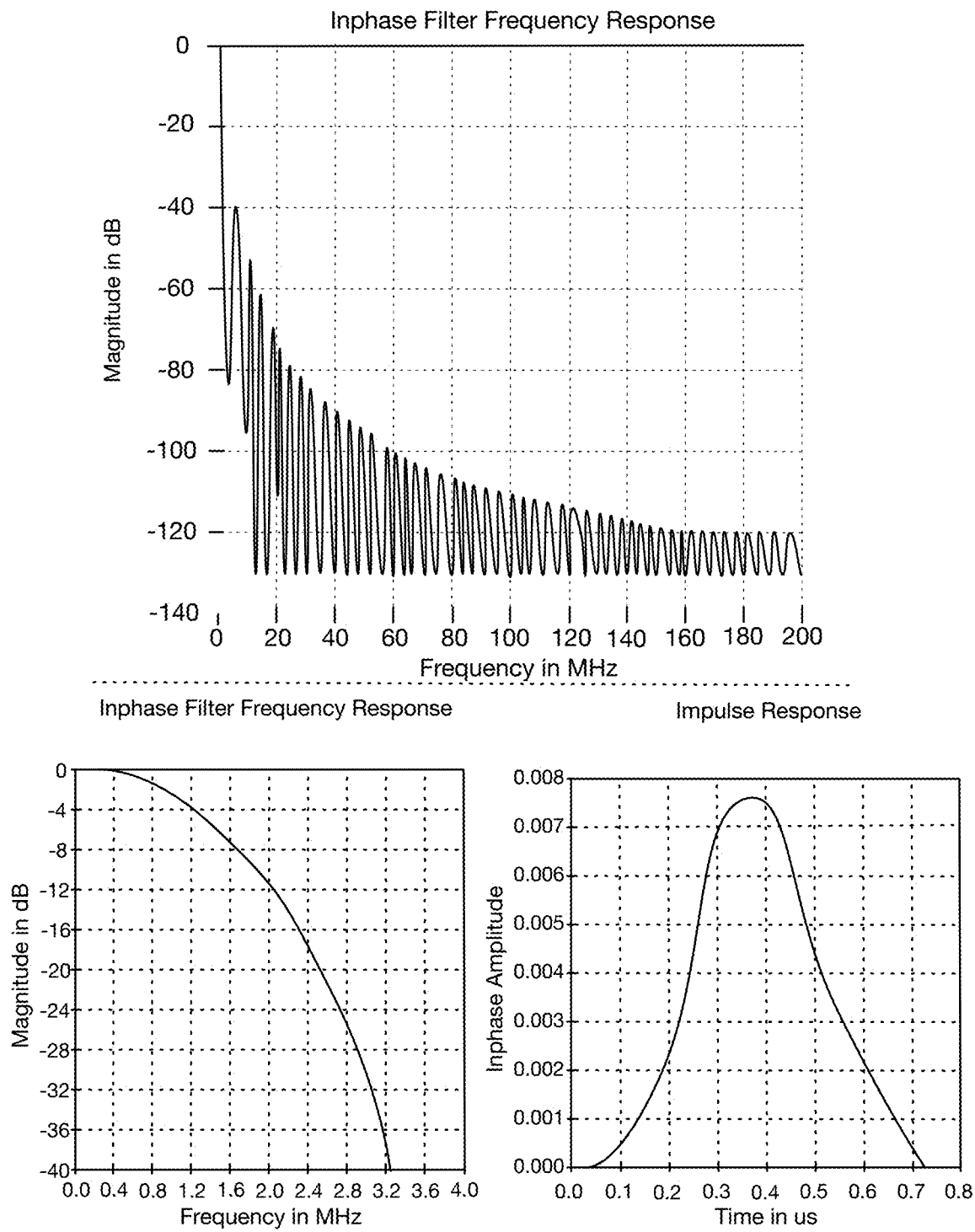
FIG. 18 is a 3rd Order, 400 Mhz, 100 decimation CIC filter.

CIC Decimator:

In an example version of the CIC decimator filter, the signal from the channel driver is converted from a 1-bit high frequency signal to a much lower frequency high resolution signal, filtered, and decimated with the CIC filter (example capability and speed as shown in FIG. 18). Decimation down ratio range of 400:1 to 100:1 will develop a final signal of 1 to 4 MHz and resolution of 14 to 16 bits per sample. These values can be adjusted to improve resolution, sample speed, and power consumption. The decimated channel signal contains the different mode signals (self-capacitance signal, for example at 200 Khz, Mutual capacitance signal, for example at 100 KHz, pen receive signal, for example at 150 KHz, and also unwanted noise signals) and these signals have to be broken out into their respective paths and further processed.

Phase and Amplitude Detector:

While many well-known methods exist for determining the phase and amplitude of a signal and picking a specific signal out of a grouping of signals (IQ demodulation being the most technical), for the purpose of this description and for simplicity the Goertzel method suffices to resolve the phase and amplitude of for each signal on a frame by frame basis. In various implementations, the Goertzel method can be modified to handle the advanced noise reduction modulation scheme described above but may be limited where for example an electrostatic pen is sending digital information using FSK, PSK, amplitude, or phase modulation, or timing between signals is concerned. Capturing this digital data will require a more advanced scheme on the pen signal path. These schemes are well understood in the industry.

Sequencing Generator:

To allow for different configurations of touchscreens to be driven and the resulting data to be mapped into memory in a known and controlled manor, a method of configuration is required that allows any driver channel to be placed into any drive order and also the resultant data to be mapped into a known area of memory such that the procedures required for the higher level blob (large noisy touchscreen contact) tracking can access the memory in an optimized and systematic way that does not require the customization of code or drivers for different size and shape sensors. This typically requires configuration arrays, a definition of how the resultant data will be mapped in memory, and definition of how and when the sensor array will be driven.

Configurable Memory Mapped Area:

The Memory Array block includes memory to store configuration arrays, resultant 2D and 3D signal levels arrays, buffer arrays, filter result arrays, and calibration arrays.

Filter Module:

To automate the repetitive tasks such as base line calibration subtraction, normalization, and filtering, the filter module works during frame data receipt and or between frames to process the received data. Processing the columns data just after completion of the row drive in the case of mutual capacitive is ideal as long as the filter processing does not interfere with the memory access of the next line of received data. Advanced memory access schemes can be used to prevent simultaneous access problems or a buffer scheme can be used to alter data in one buffer while the next buffer frame is filled.

Processor System:

Well understood and common knowledge in the field. As depicted in FIG. 1, any suitable processor core for an ASIC or FPGA may be used in various implementations.

Filter Methods:

The novel methods of noise removal herein using the simultaneous sampled data including noise, are directed towards removing coherent or spurious interfering noise signals in the touch data through the identification and removal of the noise which appears as common mode proportional changes in the sampled data.

Subtraction of common mode proportional noise in the touch data on a pCap (Projected Capacitive) sensor is a technique only possible due to the simultaneous sampling characteristics of the present invention. A user touching the system can act as an antenna and inject noise into the system. Alternately, the user may effectively act as drain to a common mode noise on the system. It is impossible to tell the difference because the noise is only seen at the touch location and the noise is proportional to the touch energy. A hard touch typically causes the highest capacitive coupling at the center of the touch due to the curvature of a finger and the pressure applied. The finger can be thought of as a low impedance source or sink for the noise. A touch measurement at the side of the finger may have half the touch energy as a touch measurement in the center due to capacitor plate area and distance. The noise on the center reading may have a SNR of 10 and the side reading will also have a SNR of 10.

If the touch readings are randomized or split in time or demodulation method, there will be no possibility of knowing the touch energy to noise energy at any instant of time, only the average noise over time. The self-capacitive signal mode of the present invention samples all the rows and columns at the same time using the same modulation scheme and filtering so all of the rows and columns will show an impulse of noise as a plus or minus to the touch profile energy. The mutual capacitance signal mode is a line scan (row) mode with simultaneous alternate line (columns) receive so all of the alternate lines (columns) will show an impulse of noise as a plus or minus to the touch profile energy under the driven line (row). Using both self and mutual data the noise change from frame to frame can be identified and directly reduced via linear or non-linear techniques.

FIG. 19 is a simple simulated example of the drive channel signals showing the drive, dither, and following (sensed) signals. Depicted are the self drive signal 1902, the mutual drive signal 1904, a Low Frequency Dither signal 1906, the sum of these signals that is driven to the reference following node of the driver, the virtual signal node, S+M+D 1908, and the resultant sigma-delta following signal 1910 which represents the drive/receive circuit's sampled sensor signal as is it is driven by the sigma-delta following circuit onto the sensor electrode.

CONCLUSION, RAMIFICATIONS AND SCOPE

The driver channel circuitry according to some embodiments of the present invention provides an apparatus and method for enhancing the development, performance, flexibility, and immunity of the multi-touch system.

While some embodiments of the invention are shown and described, it is to be distinctly understood that this invention is not limited thereto but may be variously embodied. From the foregoing description, it will be apparent that various changes may be made without departing from the spirit and scope of the invention as defined by the claims. Accordingly, the scope of the invention should not be determined not by the embodiments illustrated.

Multiple individual inventions are described herein. The inventions are patentable separately and in combinations. The combinations of features described herein should not be interpreted to be limiting, and the features herein may be used in any working combination or sub-combination according to the invention. This description should therefore be interpreted as providing written support for any working combination or sub-combination of the features herein. Various signaling and signal processing functions described above can be implemented in either hardware or software.

As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A sensor system comprising:
a first circuit operably coupled to a first electrode, wherein, when enabled, the first circuit configured to transmit a first signal via the first electrode, wherein the first circuit configured simultaneously, via the first electrode, to transmit and to detect change of the first signal; and
a second circuit operably coupled to a second electrode, wherein, when enabled, the second circuit configured to transmit a second signal via the second electrode, wherein the second circuit configured simultaneously, via the second electrode, to transmit and to detect change of the second signal that includes coupling of the first signal associated with the first electrode into the second signal associated with the second electrode.

2. The sensor system of claim 1, wherein the first circuit is further configured to detect another change of the first signal that includes coupling of the second signal associated with the second electrode into the first signal associated with the first electrode.

3. The sensor system of claim 1, wherein:
the first signal includes a first frequency; and
the second signal includes a second frequency that is different than the first frequency.

4. The sensor system of claim 1, wherein:
the first signal includes a first frequency and a second frequency that is different than the first frequency; and
the second signal includes a third frequency that is different than the first frequency and the second frequency.

5. The sensor system of claim 1, wherein:
the first electrode is included within a first plurality of sensor electrodes implemented across a touch sensor in a first direction; and
the second electrode is included within a second plurality of sensor electrodes implemented across the touch sensor in a second direction that is different than the first direction.

6. The sensor system of claim 1, wherein:
the first electrode and the second electrode are included within a plurality of sensor electrodes implemented across a touch sensor; and
interaction of a user with the at least one of the first electrode or the second electrode effectuates the coupling of the first signal transmitted associated with the first electrode into the second signal associated with the second electrode.

7. The sensor system of claim 1, wherein the first circuit further comprising:
a first sigma-delta circuitry configured to generate a first output signal based on a first input signal and a feedback signal that is associated with the first signal that is transmitted via the first electrode;
a second sigma-delta circuitry configured to generate a second output signal based on the first output signal; and
a sigma-delta filter configured to:
generate the first signal based on the second output signal; and
transmit the first signal via the first electrode, wherein the feedback signal is based on the change of the first signal.

8. The sensor system of claim 1, wherein the first circuit further comprising:
drive signal generation circuitry configured to generate a sensor drive signal;
a sigma-delta comparator configured to generate a sigma-delta comparator output signal based on the sensor drive signal and a feedback signal;
a flip-flop configured to generate a flip-flop output signal based on the sigma-delta comparator output signal;
a filter and decimator configured to generate a filtered signal based on the flip-flop output signal;
a demodulator configured to process the filtered signal to interpret interaction of a user with the first electrode;
a sigma-delta driver configured to generate a drive signal based on the flip-flop output signal;
a sigma-delta output filter configured to generate a sigma-delta output filter signal based on the drive signal; and
an EMI (electromagnetic interference) filter configured to generate the first signal based on the sigma-delta output filter signal.

9. The sensor system of claim 1, wherein the first circuit and the second circuit are implemented within an integrated circuit.

10. The sensor system of claim 1, wherein:
the first circuit including a first sigma-delta analog to digital converter (ADC) and a first sigma-delta digital to analog converter (DAC); and
the second circuit including a second sigma-delta ADC and a second sigma-delta DAC.

11. A sensor system comprising:
an electrode; and
a circuit operably coupled to the electrode, wherein, when enabled, the circuit configured to transmit a signal via the electrode, wherein the circuit configured simultaneously, via the electrode, to transmit and to detect change of the signal that is based on change of impedance of the electrode.

12. The sensor system of claim 11, wherein:
the signal includes a first frequency and a second frequency that is different than the first frequency.

13. The sensor system of claim 11, wherein the electrode is included within a plurality of sensor electrodes implemented across a touch sensor.

14. The sensor system of claim 11 further comprising:
another circuit operably coupled to another electrode, wherein, when enabled, the another circuit configured to transmit another signal via the another electrode, wherein the another circuit configured simultaneously, via the another electrode, to transmit and to detect another change of the another signal that includes coupling of the signal associated with the electrode into the another signal associated with the another electrode.

15. The sensor system of claim 14, wherein the circuit is further configured to detect at least one other change of the signal that includes coupling of the another signal associated with the another electrode into the signal associated with the electrode.

16. The sensor system of claim 14, wherein:
the signal includes a first frequency; and
the another signal includes a second frequency that is different than the first frequency.

17. The sensor system of claim 14, wherein:
the signal includes a first frequency and a second frequency that is different than the first frequency; and
the another signal includes a third frequency that is different than the first frequency and the second frequency.

18. The sensor system of claim 11, wherein the circuit further comprising:
a first sigma-delta circuitry configured to generate a first output signal based on a first input signal and a feedback signal that is associated with the signal that is transmitted via the electrode;
a second sigma-delta circuitry configured to generate a second output signal based on the first output signal; and
a sigma-delta filter configured to:
generate the signal based on the second output signal; and
transmit the signal via the electrode, wherein the feedback signal is based on the change of the signal.

19. The sensor system of claim 11, wherein the circuit further comprising:
drive signal generation circuitry configured to generate a sensor drive signal;
a sigma-delta comparator configured to generate a sigma-delta comparator output signal based on the sensor drive signal and a feedback signal;
a flip-flop configured to generate a flip-flop output signal based on the sigma-delta comparator output signal;
a filter and decimator configured to generate a filtered signal based on the flip-flop output signal;
a demodulator configured to process the filtered signal to interpret interaction of a user with the electrode;
a sigma-delta driver configured to generate a drive signal based on the flip-flop output signal;
a sigma-delta output filter configured to generate a sigma-delta output filter signal based on the drive signal; and
an EMI (electromagnetic interference) filter configured to generate the signal based on the sigma-delta output filter signal.

20. The sensor system of claim 11, wherein:
the circuit including a sigma-delta analog to digital converter (ADC) and a sigma-delta digital to analog converter (DAC).

* * * * *